United States Patent
Loubet et al.

(10) Patent No.: US 10,741,639 B2
(45) Date of Patent: Aug. 11, 2020

(54) FORMATION OF DIELECTRIC LAYER AS ETCH-STOP FOR SOURCE AND DRAIN EPITAXY DISCONNECTION

(71) Applicant: INTERNATIONAL BUSINESS MACHINES CORPORATION, Armonk, NY (US)

(72) Inventors: Nicolas Loubet, Guilderland, NY (US); Robin Hsin Kuo Chao, Cohoes, NY (US); Julien Frougier, Albany, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/146,377

(22) Filed: Sep. 28, 2018

(65) Prior Publication Data
US 2020/0105869 A1    Apr. 2, 2020

(51) Int. Cl.
| H01L 29/06 | (2006.01) |
| H01L 29/51 | (2006.01) |
| H01L 29/66 | (2006.01) |
| H01L 21/768 | (2006.01) |
| H01L 29/08 | (2006.01) |
| H01L 21/308 | (2006.01) |
| H01L 29/78 | (2006.01) |

(52) U.S. Cl.
CPC ...... *H01L 29/0649* (2013.01); *H01L 21/3086* (2013.01); *H01L 21/76829* (2013.01); *H01L 29/0673* (2013.01); *H01L 29/0847* (2013.01); *H01L 29/517* (2013.01); *H01L 29/6681* (2013.01); *H01L 29/66545* (2013.01); *H01L 29/66553* (2013.01); *H01L 29/7851* (2013.01)

(58) Field of Classification Search
CPC .................. H01L 29/0649; H01L 29/66553
See application file for complete search history.

(56) References Cited

U.S. PATENT DOCUMENTS

| 8,298,875 | B1 | 10/2012 | Or-Bach et al. |
| 8,956,942 | B2 | 2/2015 | Loubet et al. |
| 9,620,590 | B1 | 4/2017 | Bergendahl et al. |
| 9,761,722 | B1 | 9/2017 | Jagannathan et al. |
| 10,164,041 | B1 * | 12/2018 | Xie ..................... H01L 29/6656 |
| 2013/0154016 | A1 | 6/2013 | Glass et al. |

(Continued)

OTHER PUBLICATIONS

List of IBM Patents or Patent Applications Treated as Related; Date Filed: Sep. 28, 2018, 2 pages.

(Continued)

*Primary Examiner* — Raj R Gupta
(74) *Attorney, Agent, or Firm* — Cantor Colburn LLP; Joseph Petrokaitis

(57) ABSTRACT

A technique relates to a semiconductor device. A stack is formed over a bottom sacrificial layer, the bottom sacrificial layer being on a substrate. At least a portion of the bottom sacrificial layer is removed so as to create openings. Inner spacers are formed in the openings adjacent to the bottom sacrificial layer. The bottom sacrificial layer is removed so as to create a void. An isolation layer formed on the inner spacers so as to form an air gap, the isolation layer and the air gap being positioned between the stack and the substrate.

10 Claims, 39 Drawing Sheets

(56) References Cited

U.S. PATENT DOCUMENTS

2013/0277752 A1    10/2013  Glass et al.
2015/0255556 A1*    9/2015  Cheng ................ H01L 29/7813
                                                              257/332
2015/0333167 A1    11/2015  Leobandung
2017/0133459 A1     5/2017  Pranatharthiharan et al.

OTHER PUBLICATIONS

N. Loubet et al., "Stacked Nanosheet Gate-All-Around Transistor to Enable Scaling Beyond FinFET," 2017 Symposium on VLSI Technology, pp. T230-T231.

Loubet et al., "Formation of Dielectric Layer as Etch-Stop for Source and Drain Epitaxy Disconnection," U.S. Appl. No. 16/146,342, filed Sep. 28, 2018.

Q. Zhang et al., "Novel GAA Si Nanowire p-MOSFETs with Excellent Short Channel Effect Immunity via an Advanced Forming Process," IEEE Electron Device Letters, 2018, 4 pages.

* cited by examiner

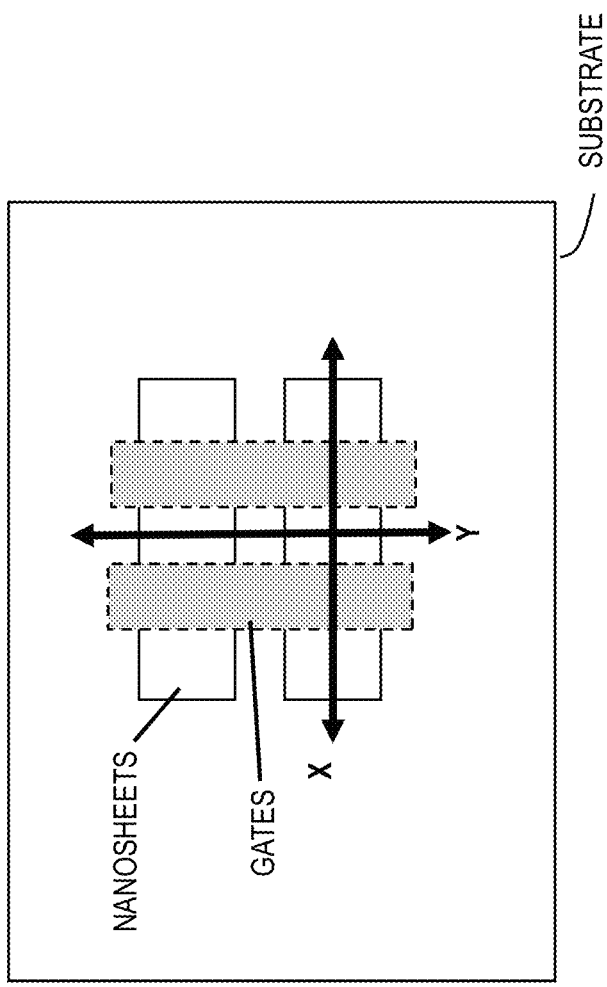

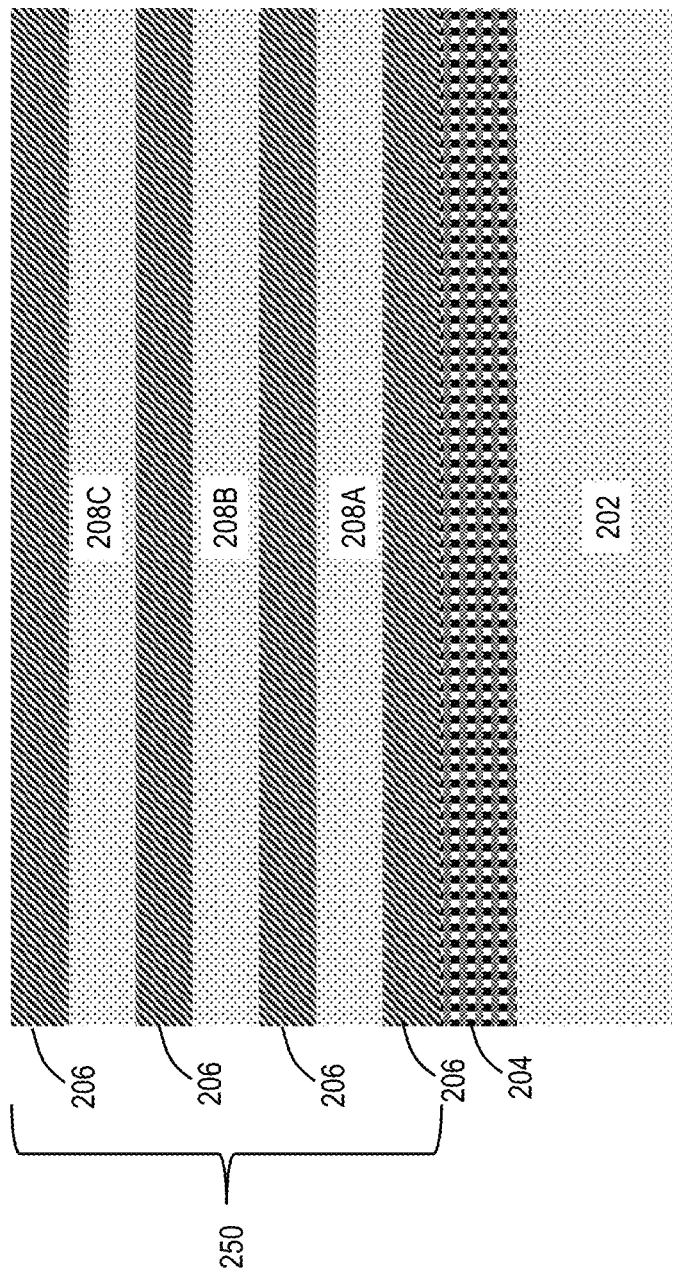
FIG. 6A

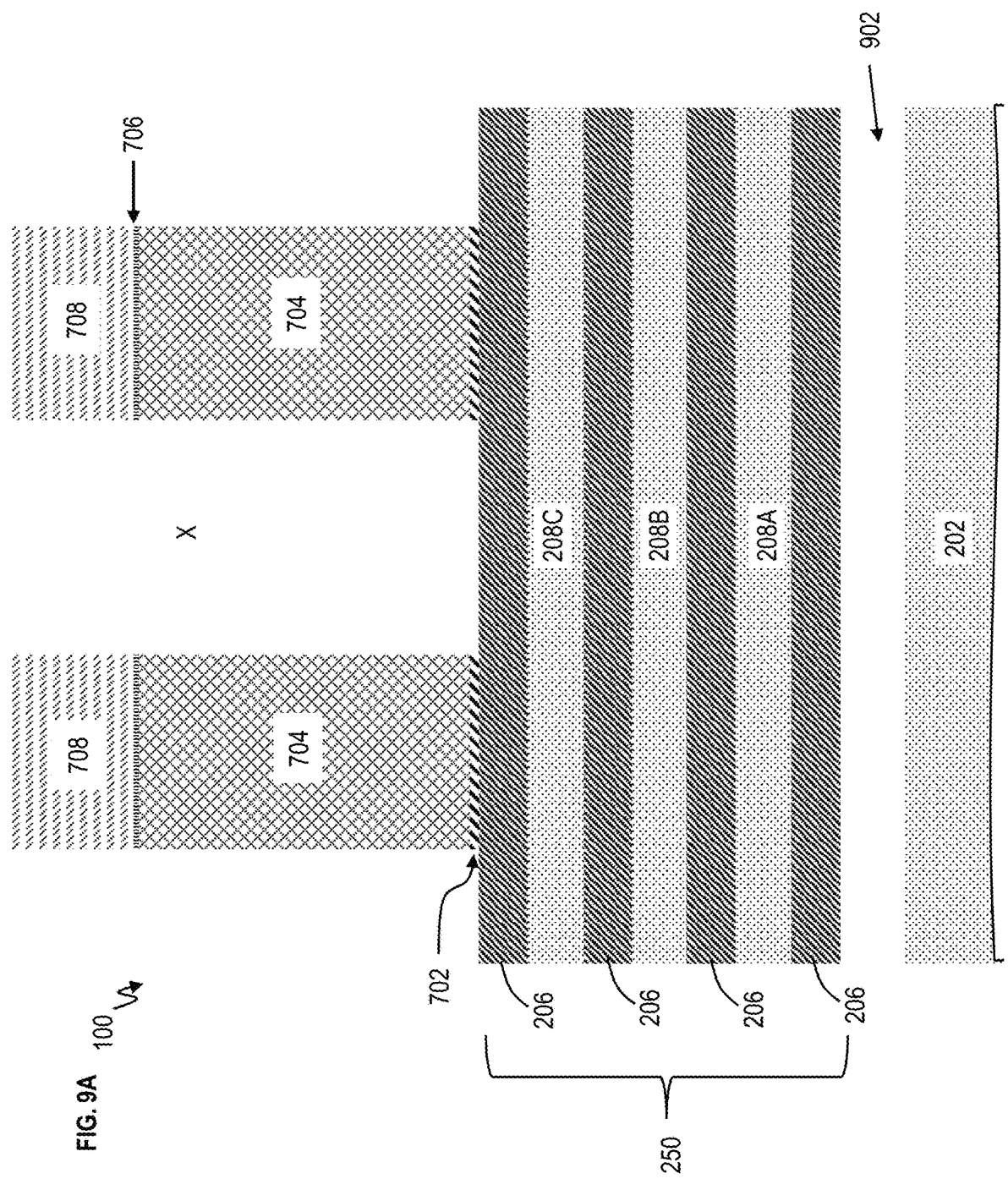

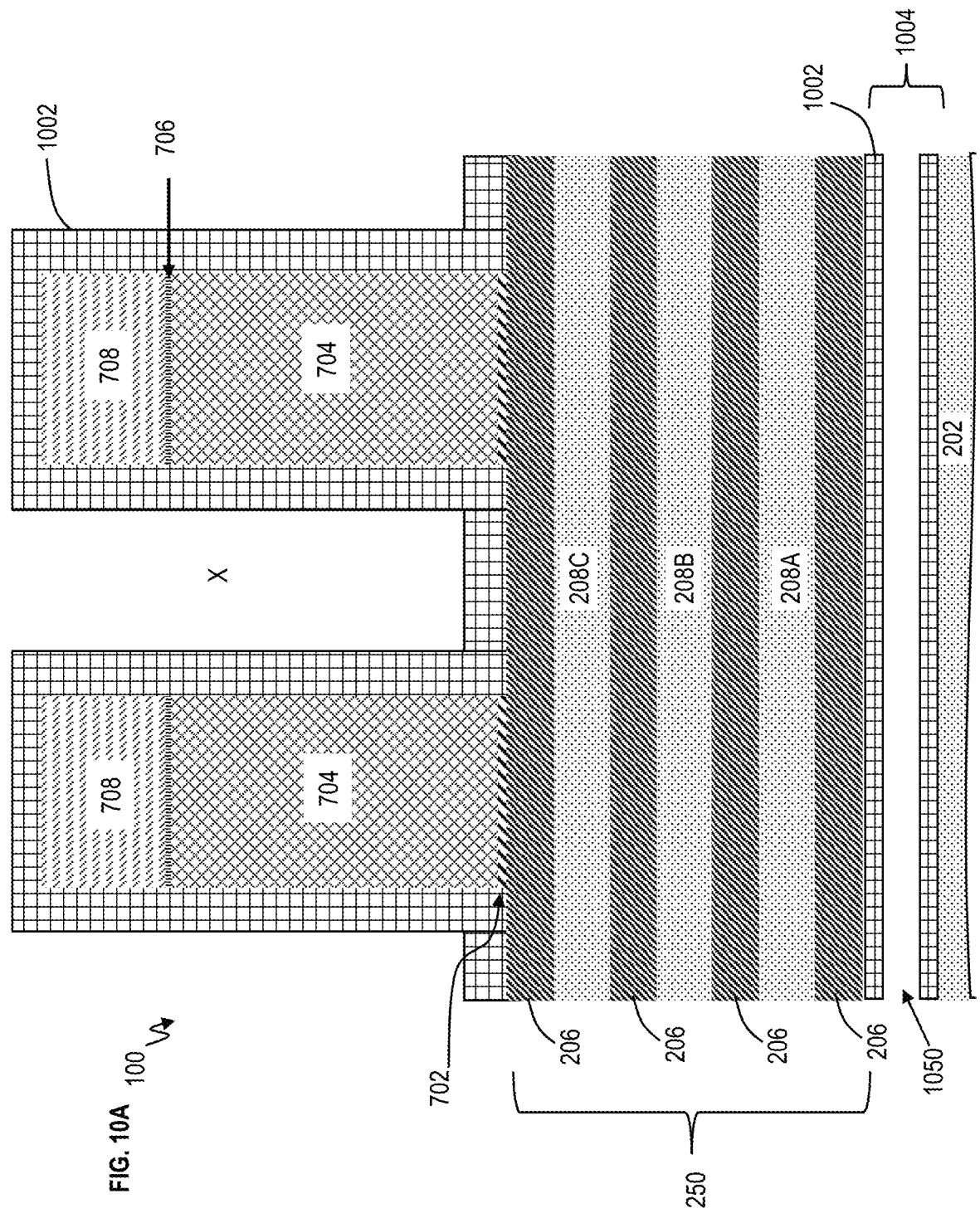

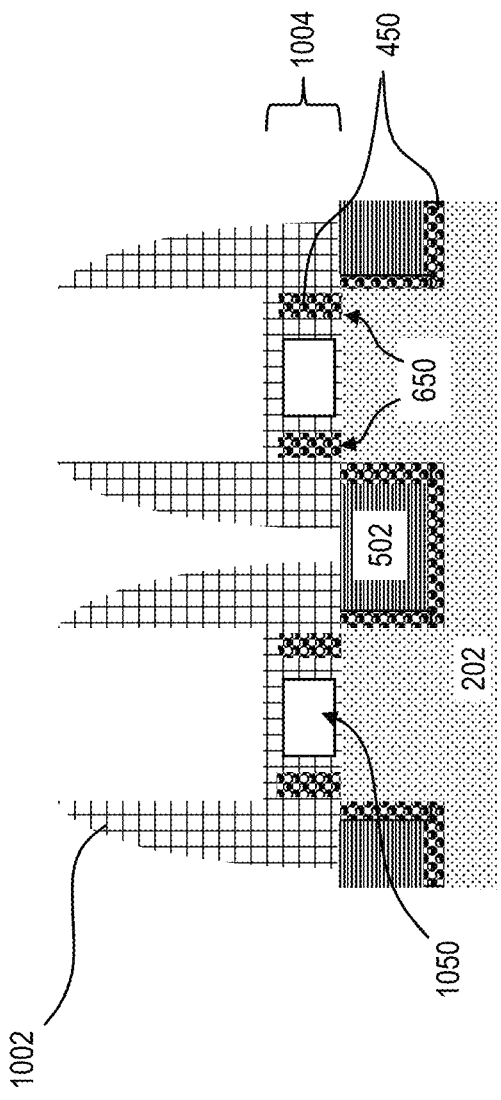
FIG. 11B

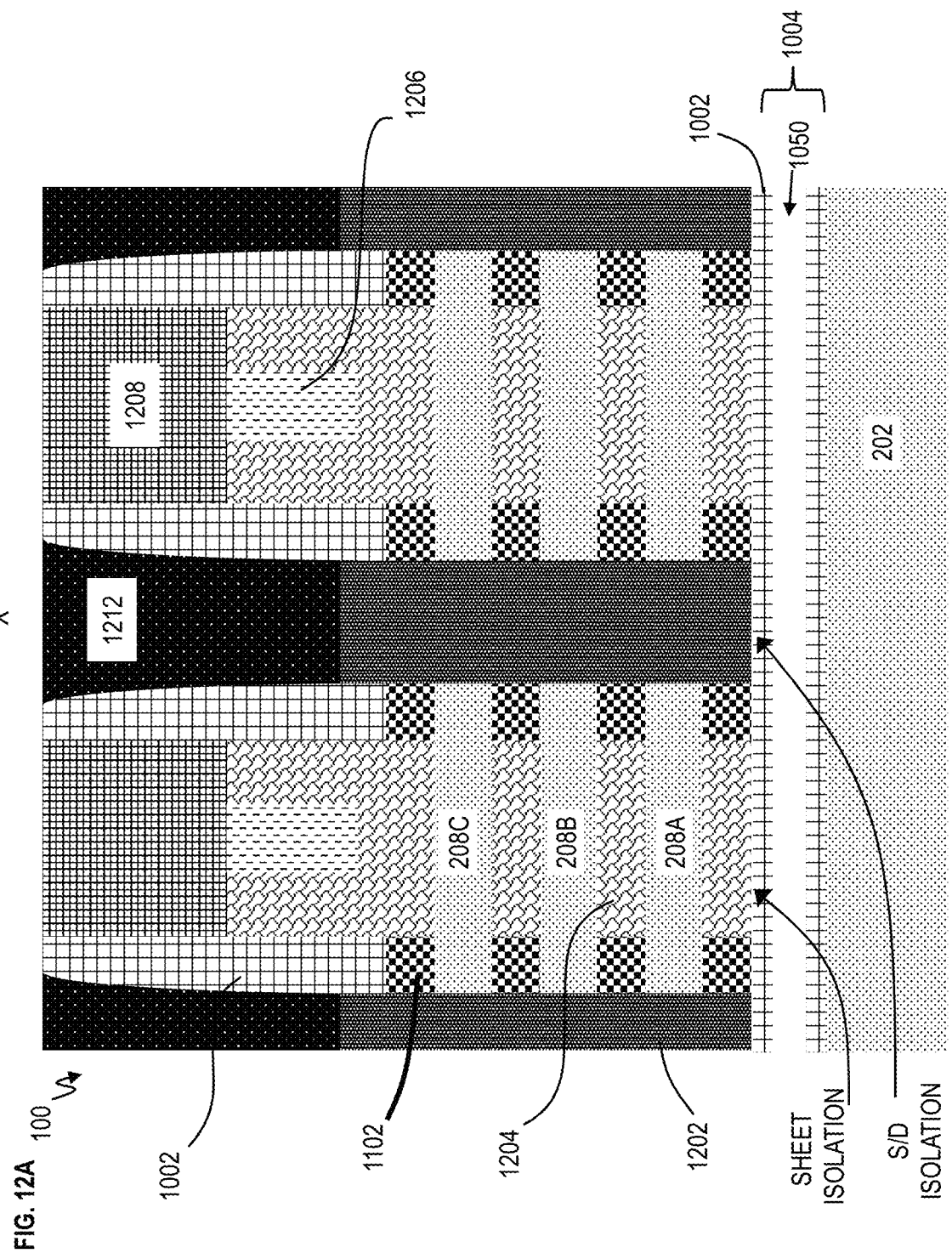

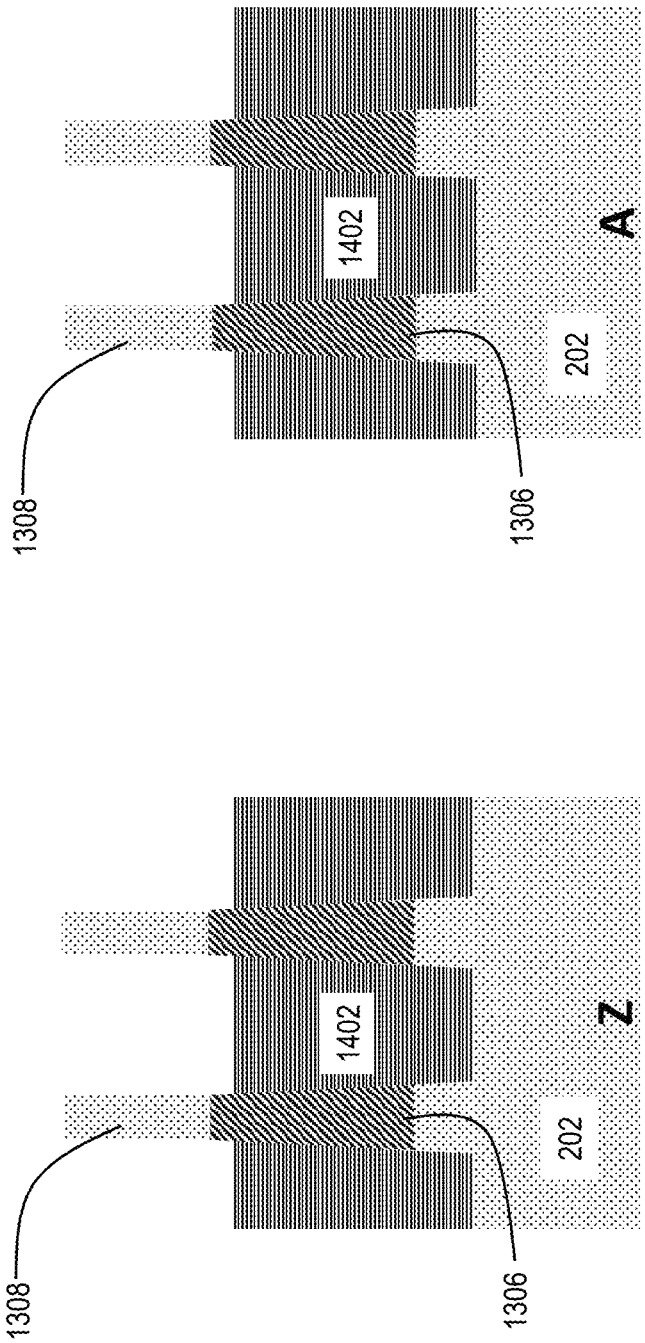

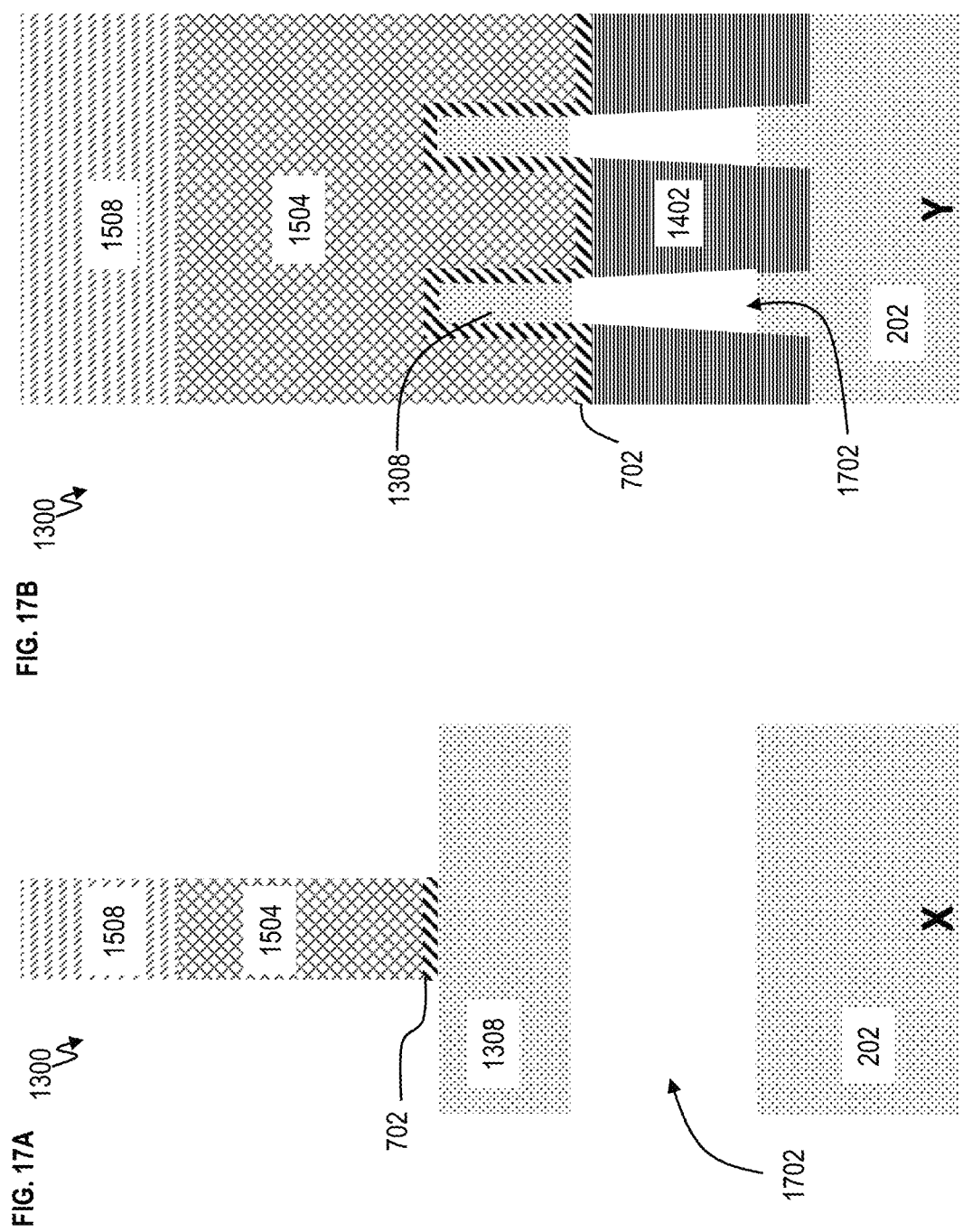

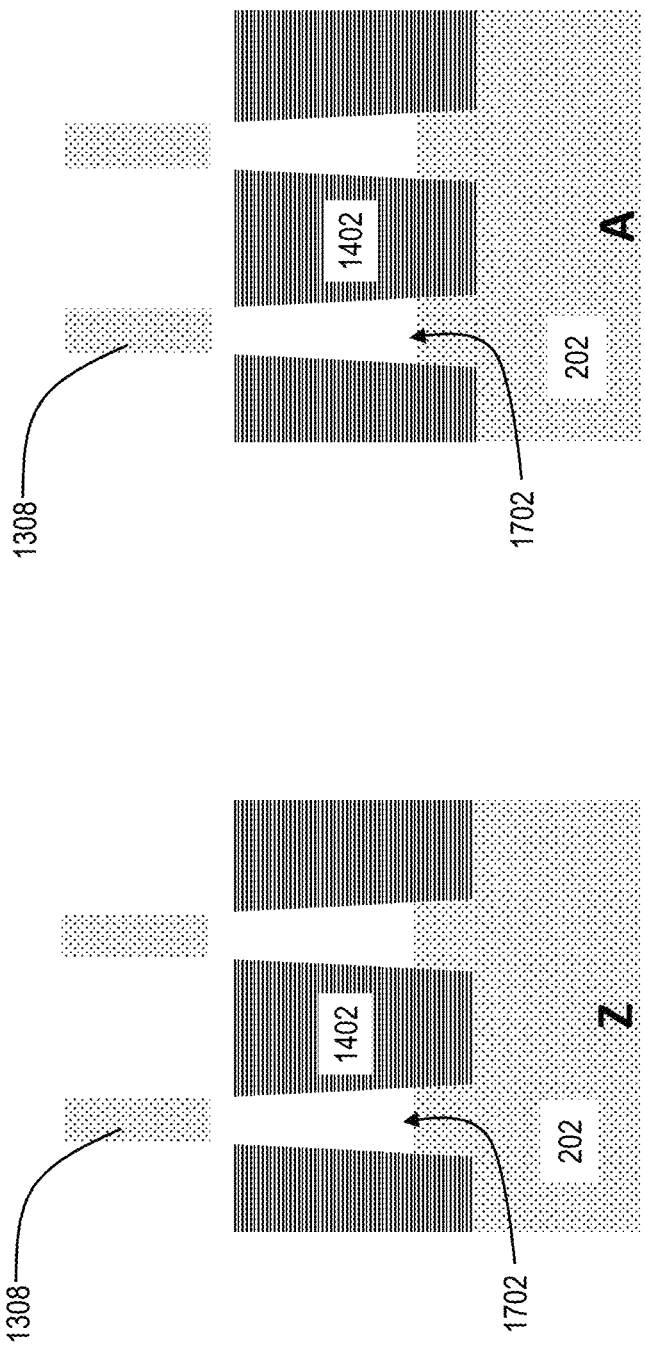

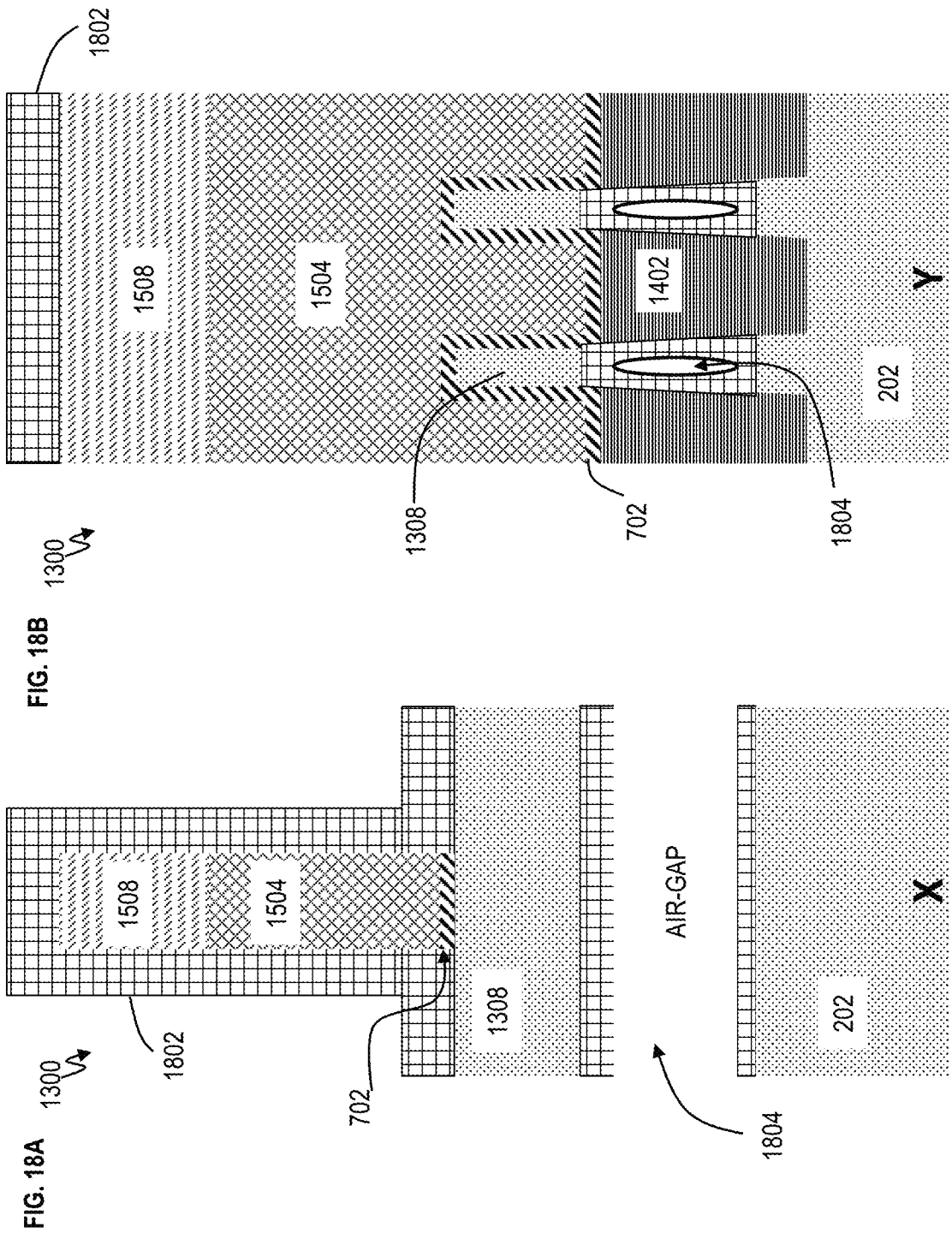

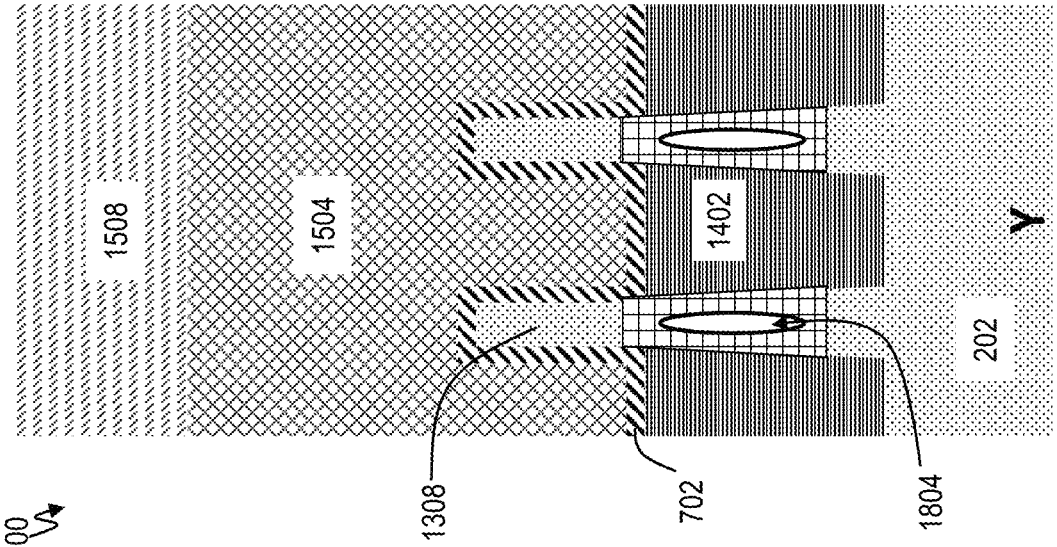
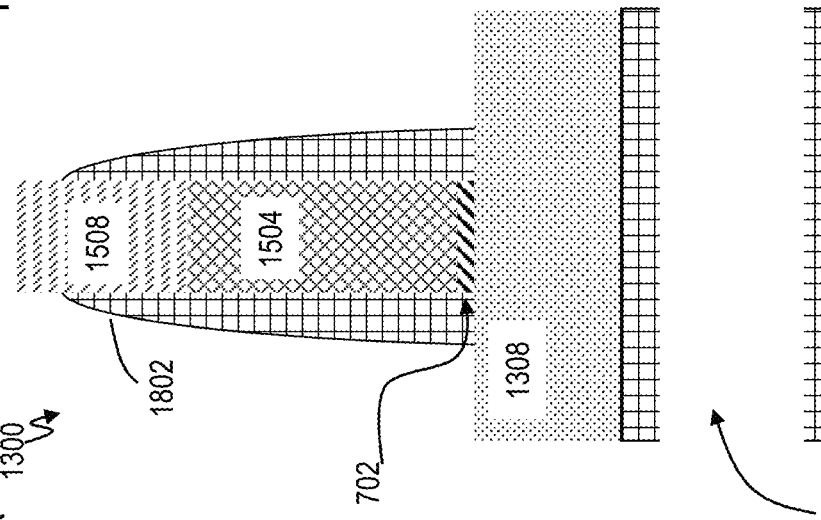
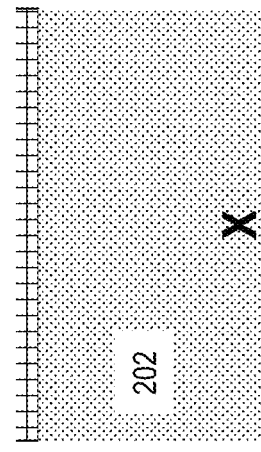
FIG. 19B
FIG. 19A

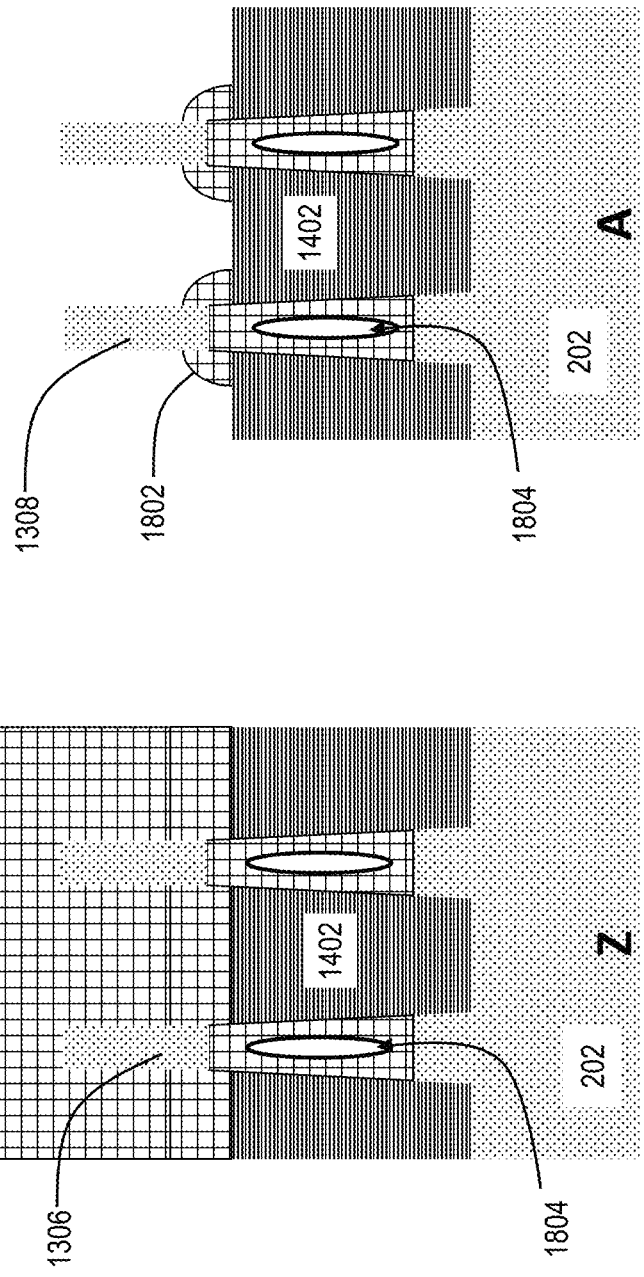

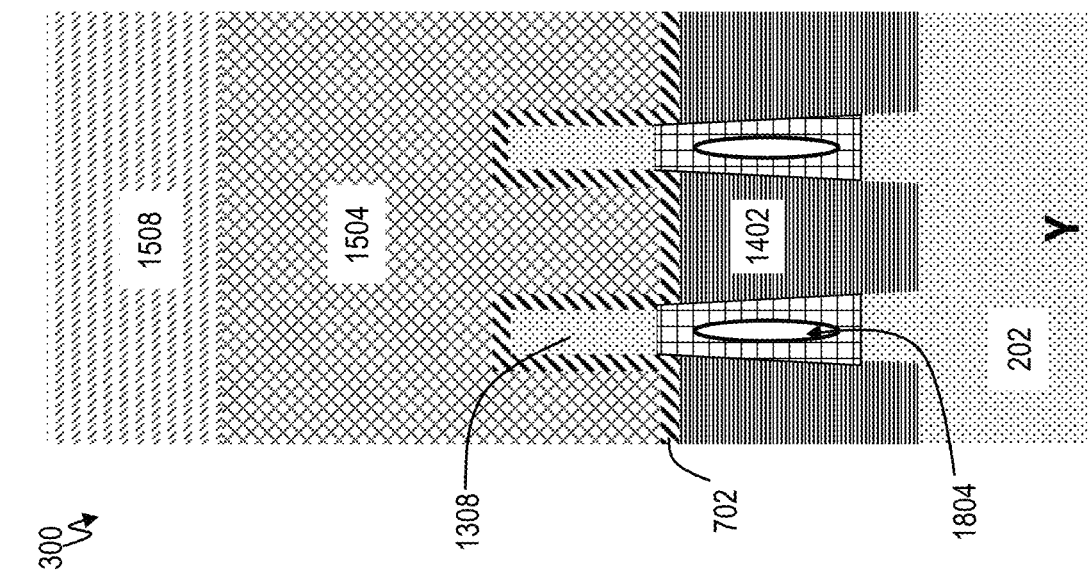
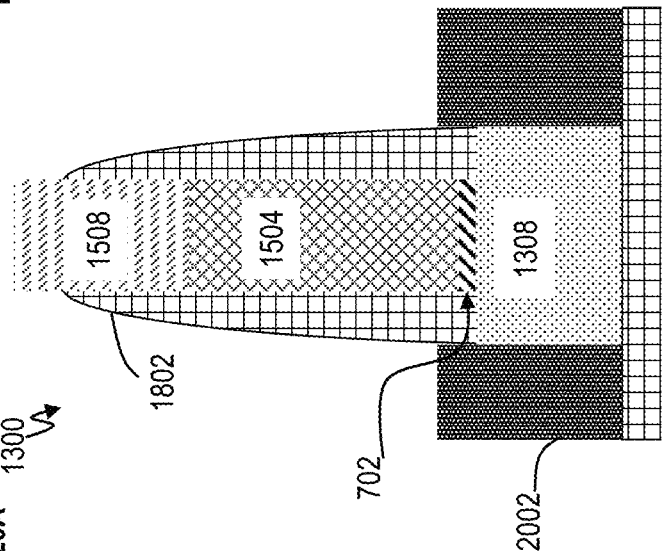
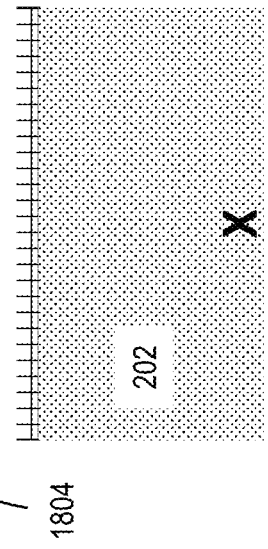
FIG. 20A
FIG. 20B

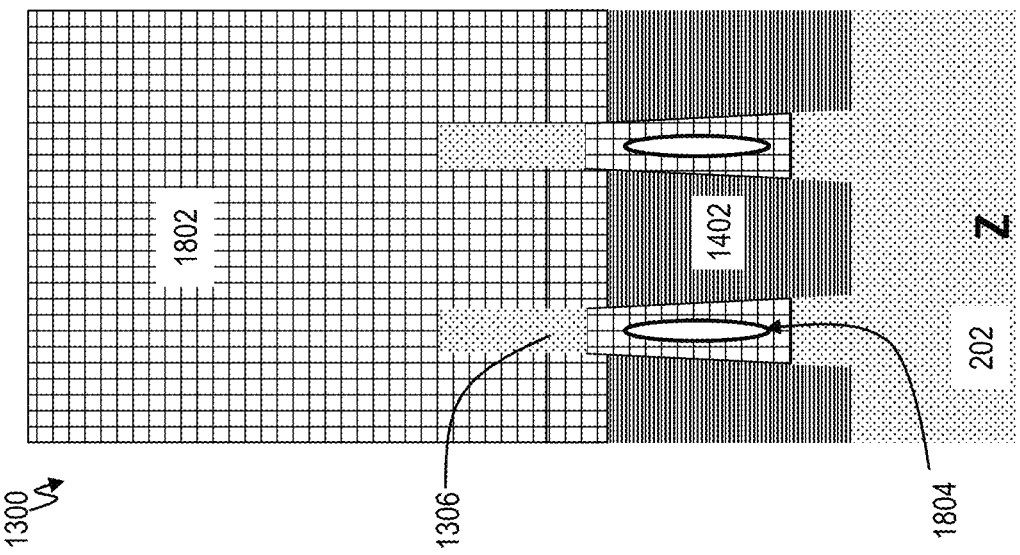
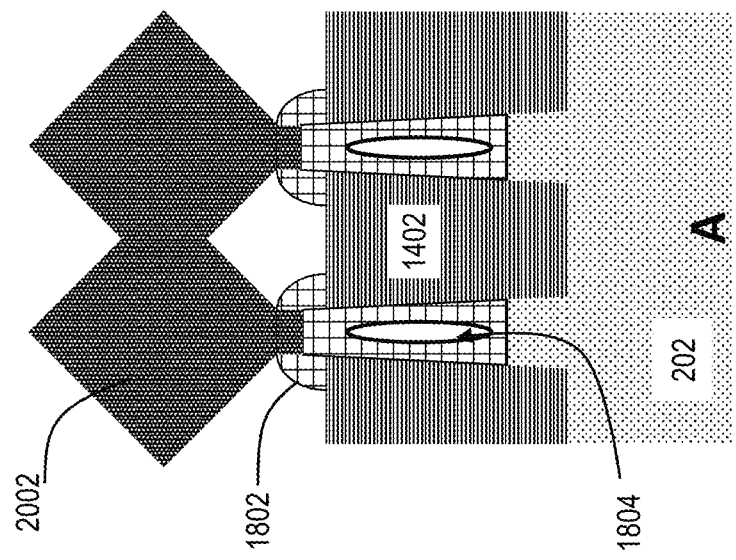
FIG. 20C
FIG. 20D

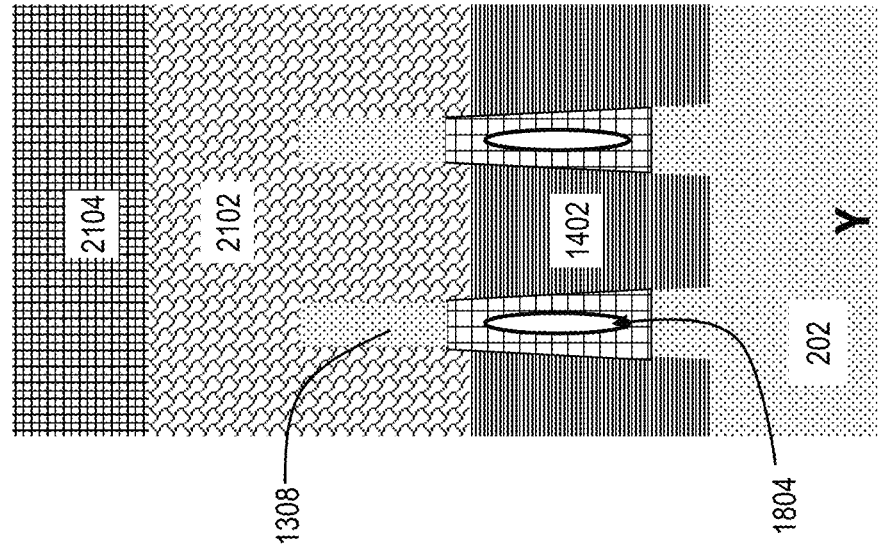
FIG. 21A
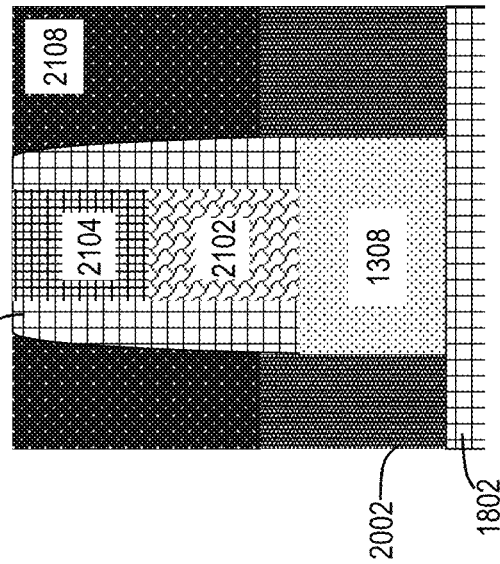
FIG. 21B
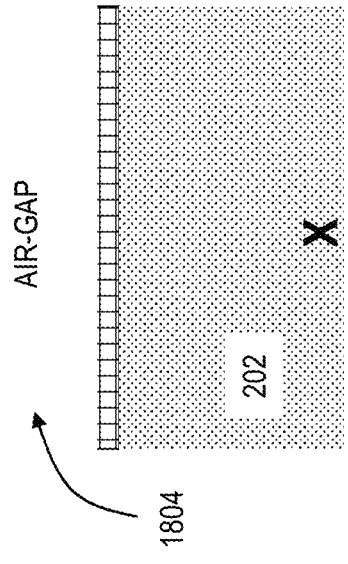

FORMATION OF DIELECTRIC LAYER AS ETCH-STOP FOR SOURCE AND DRAIN EPITAXY DISCONNECTION

BACKGROUND

The present invention generally relates to fabrication methods and resulting structures for semiconductor devices, and more specifically, to formation of a dielectric layer as etch-stop for source and drain epitaxy disconnection.

In contemporary semiconductor device fabrication processes, a large number of semiconductor devices, such as n-type field effect transistors (nFETs) and p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow. Nanosheet transistor configurations enable fuller depletion in the nanosheet channel regions and reduce short-channel effects.

SUMMARY

Embodiments of the invention are directed to a method for forming a semiconductor device. A non-limiting example of the method includes forming a stack over a bottom sacrificial layer, the bottom sacrificial layer being on a substrate, and removing at least a portion of the bottom sacrificial layer so as to create openings. The method includes forming inner spacers in the openings adjacent to the bottom sacrificial layer, removing the bottom sacrificial layer so as to create a void, and forming an isolation layer on the inner spacers so as to form an air gap, the isolation layer and the air gap being positioned between the stack and the substrate.

Embodiments of the invention are directed to a method for forming a semiconductor device. A non-limiting example of the method includes forming at least one fin over a bottom sacrificial layer, the bottom sacrificial layer being on a substrate, and removing the bottom sacrificial layer so as to create an opening. Also, the method includes forming an isolation layer on the at least one fin and the substrate so as to form the opening into an air gap, the isolation layer and the air gap being positioned between the at least one fin and the substrate.

Embodiments of the invention are directed to a semiconductor device. A non-limiting example of the semiconductor device includes an isolation layer and an air gap formed over a substrate, a conductive gate structure formed over the isolation layer and the air gap. Also, the device includes source and drain regions formed over the isolation layer and the air gap, and a semiconductor material formed adjacent to the conductive gate structure.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a simple diagram of a top view of a semiconductor device according to embodiments of the invention;

FIG. 6A depicts a cross-sectional view of the semiconductor device taken along line X (shown in FIG. 1) after fabrication operations according to embodiments of the invention;

FIG. 9A depicts a cross-sectional view of the semiconductor device taken along line X (shown in FIG. 1) after fabrication operations according to embodiments of the invention;

FIG. 10A depicts a cross-sectional view of the semiconductor device taken along line X (shown in FIG. 1) after fabrication operations according to embodiments of the invention;

FIG. 11B depicts a cross-sectional view of the semiconductor device taken along line Y (shown in FIG. 1) after fabrication operations according to embodiments of the invention FIG. 12A depicts a cross-sectional view of the semiconductor device taken along line X (shown in FIG. 1) after fabrication operations according to embodiments of the invention;

FIG. 16C depicts a cross-sectional view of the semiconductor device taken along line Z (shown in FIG. 13A) after fabrication operations according to embodiments of the invention;

FIG. 16D depicts a cross-sectional view of the semiconductor device taken along line A (shown in FIG. 13A) after fabrication operations according to embodiments of the invention;

FIG. 17A depicts a cross-sectional view of the semiconductor device taken along line X (shown in FIG. 13A) after fabrication operations according to embodiments of the invention;

FIG. 17B depicts a cross-sectional view of the semiconductor device taken along line Y (shown in FIG. 13A) after fabrication operations according to embodiments of the invention;

FIG. 17C depicts a cross-sectional view of the semiconductor device taken along line Z (shown in FIG. 13A) after fabrication operations according to embodiments of the invention;

FIG. 17D depicts a cross-sectional view of the semiconductor device taken along line A (shown in FIG. 13A) after fabrication operations according to embodiments of the invention;

FIG. 18A depicts a cross-sectional view of the semiconductor device taken along line X (shown in FIG. 13A) after fabrication operations according to embodiments of the invention;

FIG. 18B depicts a cross-sectional view of the semiconductor device taken along line Y (shown in FIG. 13A) after fabrication operations according to embodiments of the invention;

FIG. 19A depicts a cross-sectional view of the semiconductor device taken along line X (shown in FIG. 13A) after fabrication operations according to embodiments of the invention;

FIG. 19B depicts a cross-sectional view of the semiconductor device taken along line Y (shown in FIG. 13A) after fabrication operations according to embodiments of the invention;

FIG. 19C depicts a cross-sectional view of the semiconductor device taken along line Z (shown in FIG. 13A) after fabrication operations according to embodiments of the invention;

FIG. 19D depicts a cross-sectional view of the semiconductor device taken along line A (shown in FIG. 13A) after fabrication operations according to embodiments of the invention;

FIG. 20A depicts a cross-sectional view of the semiconductor device taken along line X (shown in FIG. 13A) after fabrication operations according to embodiments of the invention;

FIG. 20B depicts a cross-sectional view of the semiconductor device taken along line Y (shown in FIG. 13A) after fabrication operations according to embodiments of the invention;

FIG. 20C depicts a cross-sectional view of the semiconductor device taken along line Z (shown in FIG. 13A) after fabrication operations according to embodiments of the invention;

FIG. 20D depicts a cross-sectional view of the semiconductor device taken along line A (shown in FIG. 13A) after fabrication operations according to embodiments of the invention;

FIG. 21A depicts a cross-sectional view of the semiconductor device taken along line X (shown in FIG. 13A) after fabrication operations according to embodiments of the invention;

FIG. 21B depicts a cross-sectional view of the semiconductor device taken along line Y (shown in FIG. 13A) after fabrication operations according to embodiments of the invention;

Figure 2A:
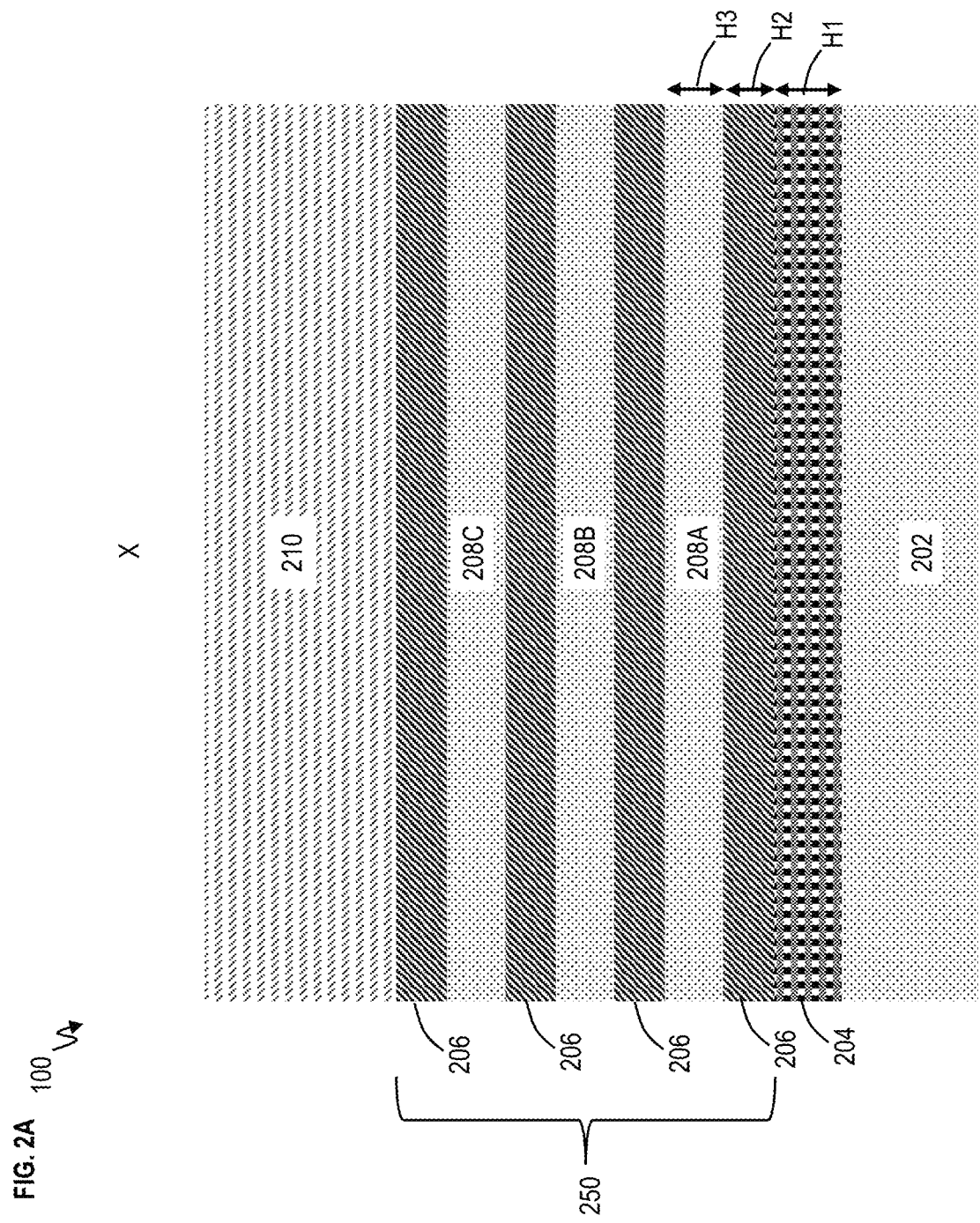
FIG. 2A depicts a cross-sectional view of the semiconductor device taken along line X in FIG. 1 after an initial set of fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a metal-oxide-semiconductor field-effect transistors (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on").

N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers. Complementary metal oxide semiconductor (CMOS) is a technology that uses complementary and symmetrical pairs of p-type and n-type MOSFETs to implement logic functions.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

For nanosheet devices formed on a bulk substrate, the source and drain regions are epitaxially grown from (1) the side of the silicon nanosheets and (2) the bottom silicon substrate. This leads to parasitic source and drain leakage harming nanosheet FET performance. Particularly, the combination of the (1) epitaxy contacting the substrate in the source/drain region and (2) the high-k metal gate (HKMG) stack formed directly on the substrate in the sub-fin region form a bottom parasitic planar transistor degrading the performance of the gate-all-around nanosheet-FET. Accordingly, a better integration scheme is needed.

Turning now to an overview of the aspects of the invention, one or more embodiments of the invention provide semiconductor devices and methods of forming the semiconductor devices. Embodiments of the invention provide integration methods to form full bottom dielectric isolation of nanosheet FETs and/or FinFETs. Accordingly, the bottom dielectric isolation layer isolates the source and drain regions from the substrate and/or isolates the nanosheet region (or sub-Fin region) from the substrate. Particularly, embodiments of the invention provide silicon-on-insulator (SOI) like isolation on a bulk substrate without requiring additional masks to form anchors in the fabrication process. Further, embodiments of the invention provide full isolation without a requirement for Limited Canyon Space design between the gates (i.e., LimCA is not required). Additionally, a self-aligned dielectric etch stop is provided during the spacer/fin etching operation (e.g., reactive ion etch (RIE)) which will prevent any over-etch into the substrate.

Figure 2B:
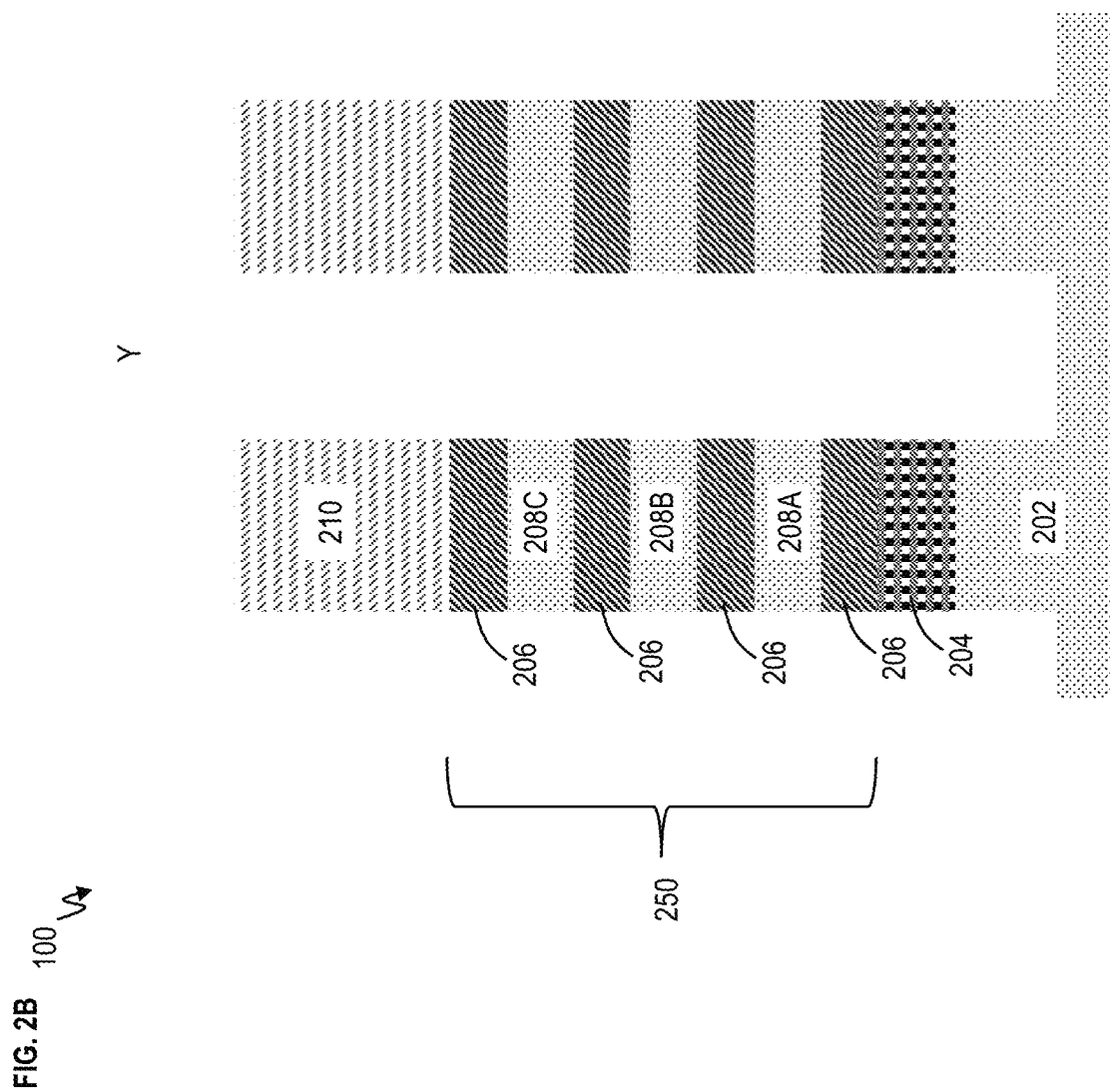
FIG. 2B depicts a cross-sectional view of the semiconductor device taken along line Y in FIG. 1 after an initial set of fabrication operations according to embodiments of the invention.

Turning now to a more detailed description of aspects of the present invention, FIG. 1 depicts a simple diagram of a top view of a semiconductor device 100 according to embodiments of the invention. FIG. 1 is only for reference and illustrates a top-down view of locations of the nanosheets and future gates. For simplicity and ease of understanding, FIG. 1 omits some layers (elements) so as to not obscure the figure. FIG. 2A depicts a cross-sectional view of the semiconductor device 100 shown in FIG. 1 taken along line X according to embodiments of the invention. FIG. 2B depicts a cross-sectional view of the semiconductor device 100 shown in FIG. 1 taken along line Y according to embodiments of the invention.

Referring to FIG. 2A, the semiconductor device 100 includes substrate 202. The substrate 202 is formed of semiconductor material. The substrate 202 can be a silicon (Si) substrate, although other materials can be used. After initial fabrication processing, a sacrificial bottom isolation layer 204 is formed on top of the substrate 202 so as to be under an epitaxy nanosheet stack 250 (or fin-like structure). After forming the sacrificial bottom isolation layer 204, the epitaxy nanosheet stack 250 is then formed. The epitaxy nanosheet stack 250 includes sacrificial layers 206 alternatingly formed with channel layer 208A, 208B, and 208C. The channel layer 208A, 208B, and 208C can be generally referred to as channel layers 208. Although three channel layers 208 are shown, more or fewer channel layers 208 can be used, and the number of sacrificial layers 206 will be increased or decreased accordingly. The sacrificial bottom isolation layer 204, sacrificial layers 206, and channel layers 208 can be epitaxially grown.

The sacrificial bottom isolation layer 204 is a material that can be removed (i.e., etched) without etching the layers in the stack 250. That is, the sacrificial bottom isolation layer 204 can be etched/removed without removing the sacrificial layers 206 and the channel layers 208. The sacrificial bottom isolation layer 204 can be silicon germanium (SiGe). To cause the sacrificial bottom isolation layer 204 to be removed/etched without etching the other layers, the sacrificial bottom isolation layer 204 can be $SiGe_{y\ \%}$ where the atomic percent % for "y" ranges from 50-70% atomic percent. Particularly, y in $SiGe_{y\ \%}$ of sacrificial bottom isolation layer 204 can be about (or at least) 60% atomic percent such that the sacrificial bottom isolation layer 204 can be etched/removed without etching layers 206 and 208.

The material of the sacrificial layers 206 can also include $SiGe_{x\ \%}$ where the atomic percent % for "x" ranges from about 15-35% atomic percent (i.e., x is less than y). The material of the channel layers 208 can include Si. The thickness or height H1 of the sacrificial bottom isolation layer 204 can range from about 5 nm to 15 nm, the height H2 of each sacrificial layer 206 can be range from about 5 nm to 15 nm, and the height H3 of each channel layer 208 can range from about 5 nm to 15 nm.

Using semiconductor lithography, fin patterning and formation are performed by forming a fin hard mask 210 on top of the upper sacrificial layer 206. The fin hard mask 210 can be a nitride material, an oxide material, and/or a combination of oxide and nitride materials. Unprotected layers are etched so as to create fin-like structures down through the substrate 202 as can be seen in FIG. 2B.

Figure 3A:
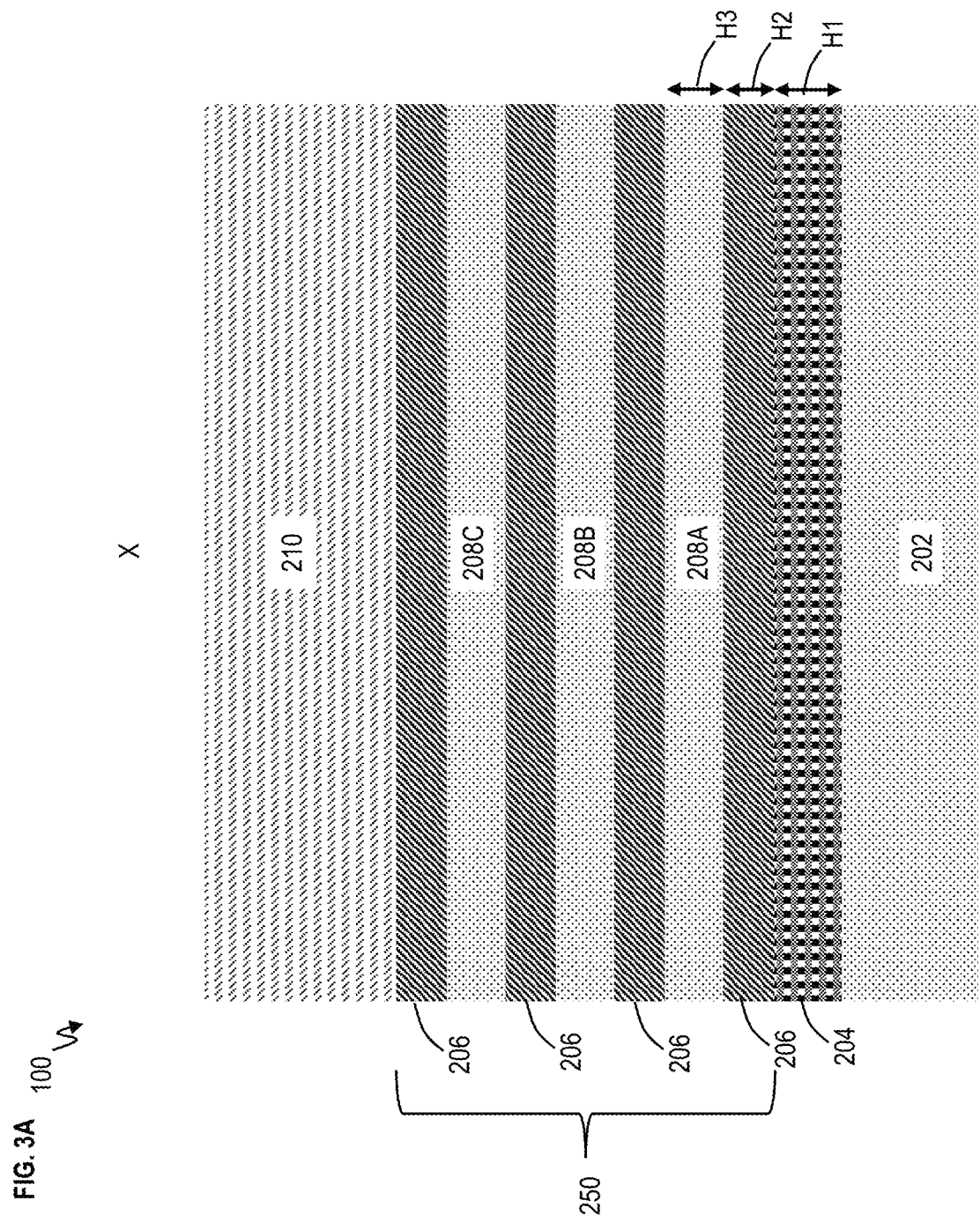
FIG. 3A depicts a cross-sectional view of the semiconductor device taken along line X (shown in FIG. 1) after fabrication operations according to embodiments of the invention.
Figure 3B:
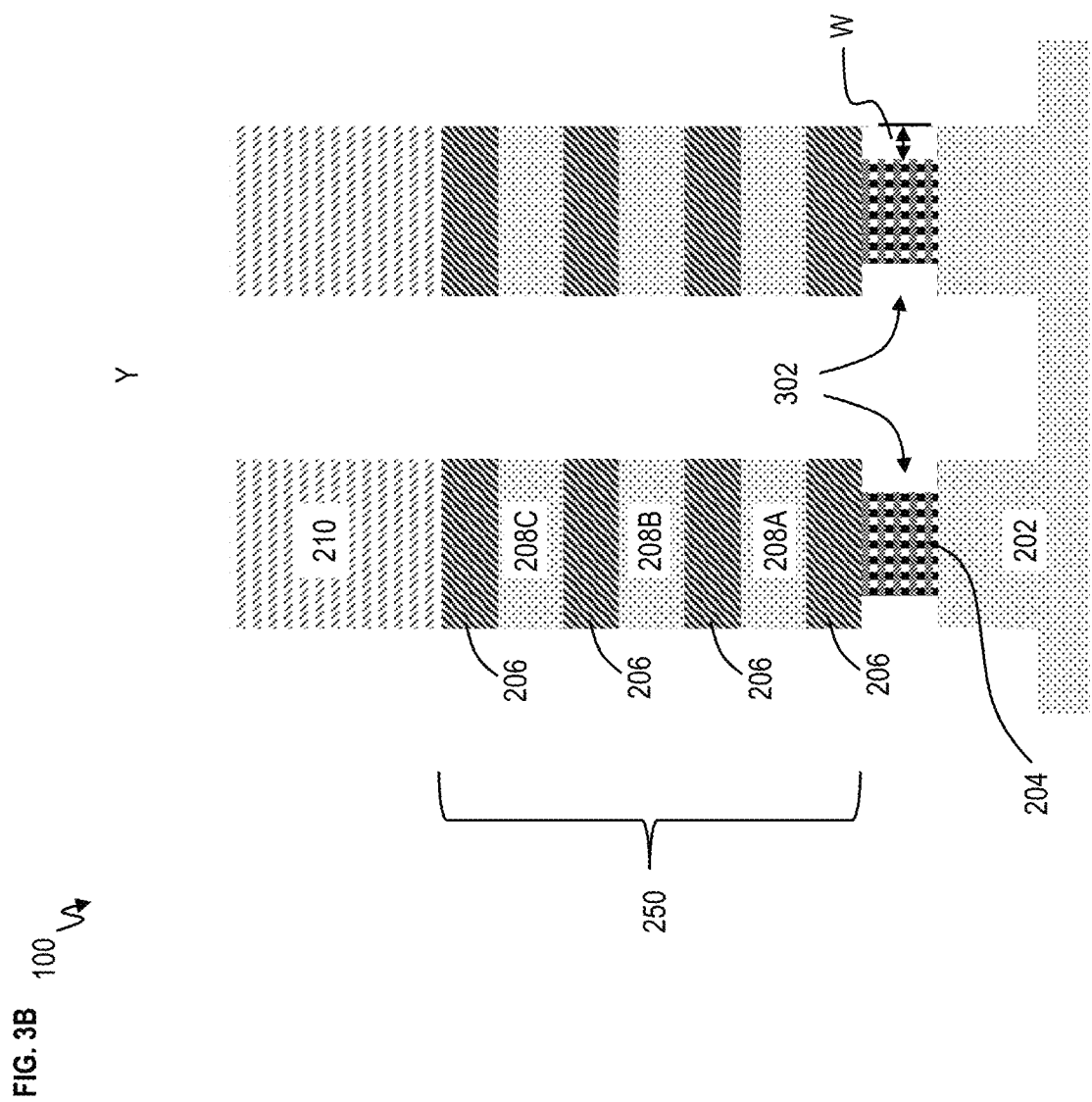
FIG. 3B depicts a cross-sectional view of the semiconductor device taken along line Y (shown in FIG. 1) after fabrication operations according to embodiments of the invention.

FIG. 3A depicts a cross-sectional view of the semiconductor device 100 taken along line X according to embodiments of the invention. FIG. 3B depicts a cross-sectional view of the semiconductor device 100 taken along line Y according to embodiments of the invention. As seen in FIG. 3B, etching is performed to selectively remove portions of the sacrificial bottom isolation layer 204 resulting in cavities/indentations 302, while not etching sacrificial layers 206 and channel layers 208. Wet etch such as hot SC-1 (standard clean 1 which includes deionized water, ammonia ($NH_3$), and aqueous hydrogen peroxide ($H_2O_2$)) or dry etch such as vapor phase HCl or $ClF_3$ can be used to selectively etch cavities/indentations 302 into sacrificial bottom isolation layer 204. The cavities/indentations 302 can have a width W of a couple of nanometers (nm), for example 2-3 nm.

Figure 4A:
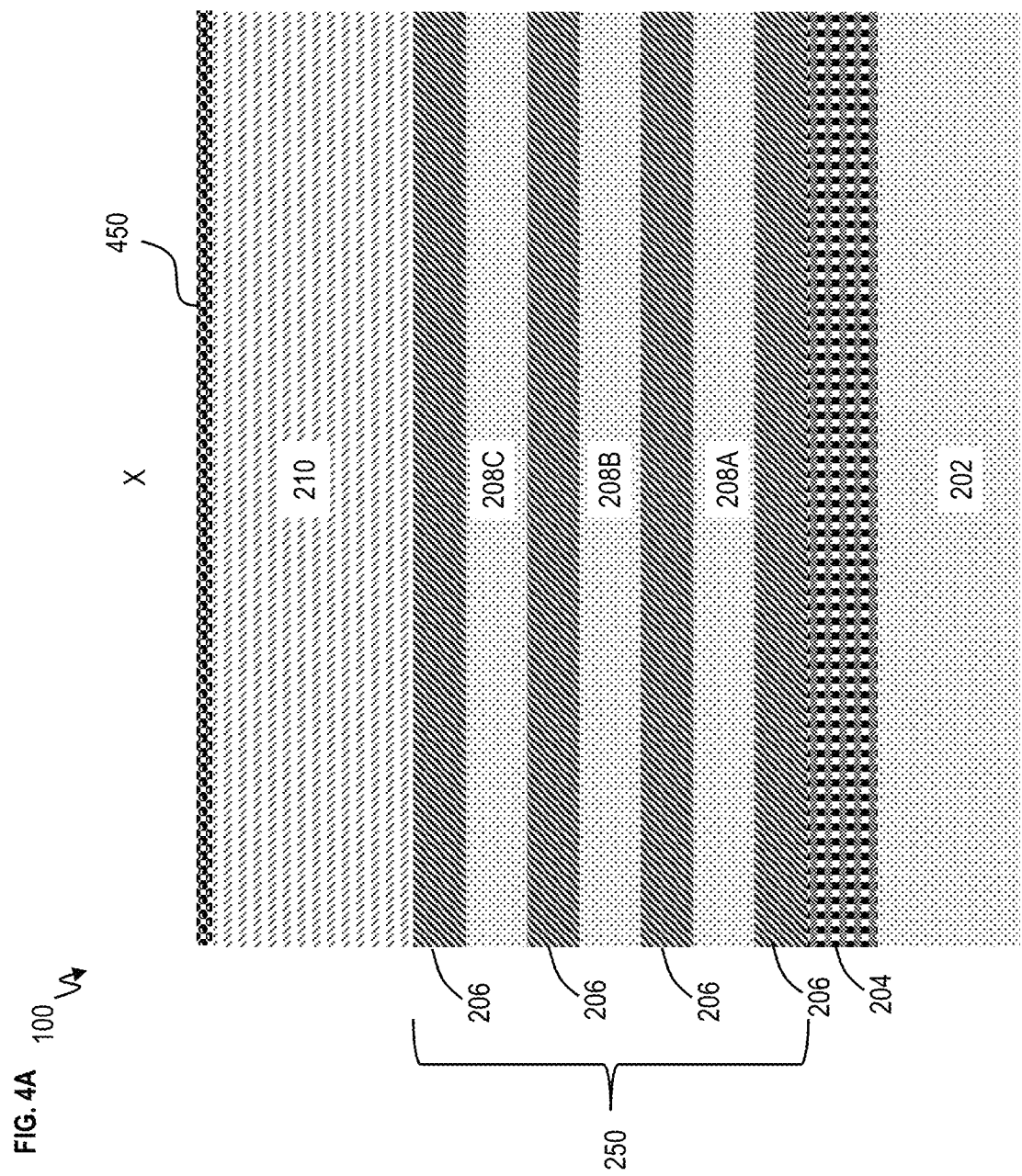
FIG. 4A depicts a cross-sectional view of the semiconductor device taken along line X (shown in FIG. 1) after fabrication operations according to embodiments of the invention.
Figure 4B:
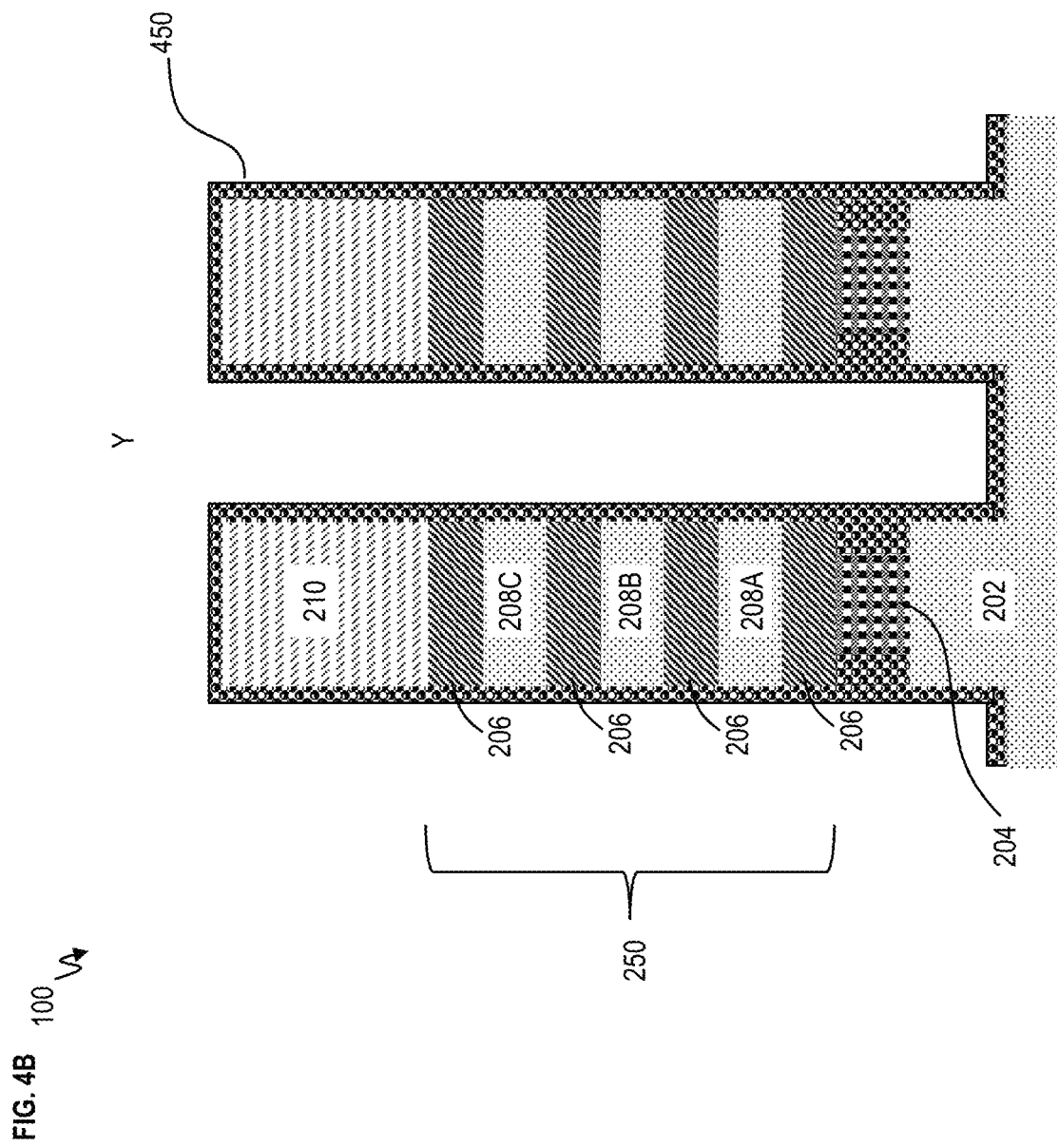
FIG. 4B depicts a cross-sectional view of the semiconductor device taken along line Y (shown in FIG. 1) after fabrication operations according to embodiments of the invention.

FIG. 4A depicts a cross-sectional view of the semiconductor device 100 taken along line X according to embodiments of the invention. FIG. 4B depicts a cross-sectional view of the semiconductor device 100 taken along line Y according to embodiments of the invention. Conformal deposition of low-k dielectric liner 450 is performed. The low-k dielectric liner 450 is formed in and pinches off the indentations 302 (shown in FIG. 3B). The low-k dielectric liner 450 can be a nitride, such as silicon nitride (SiN).

Figure 5A:
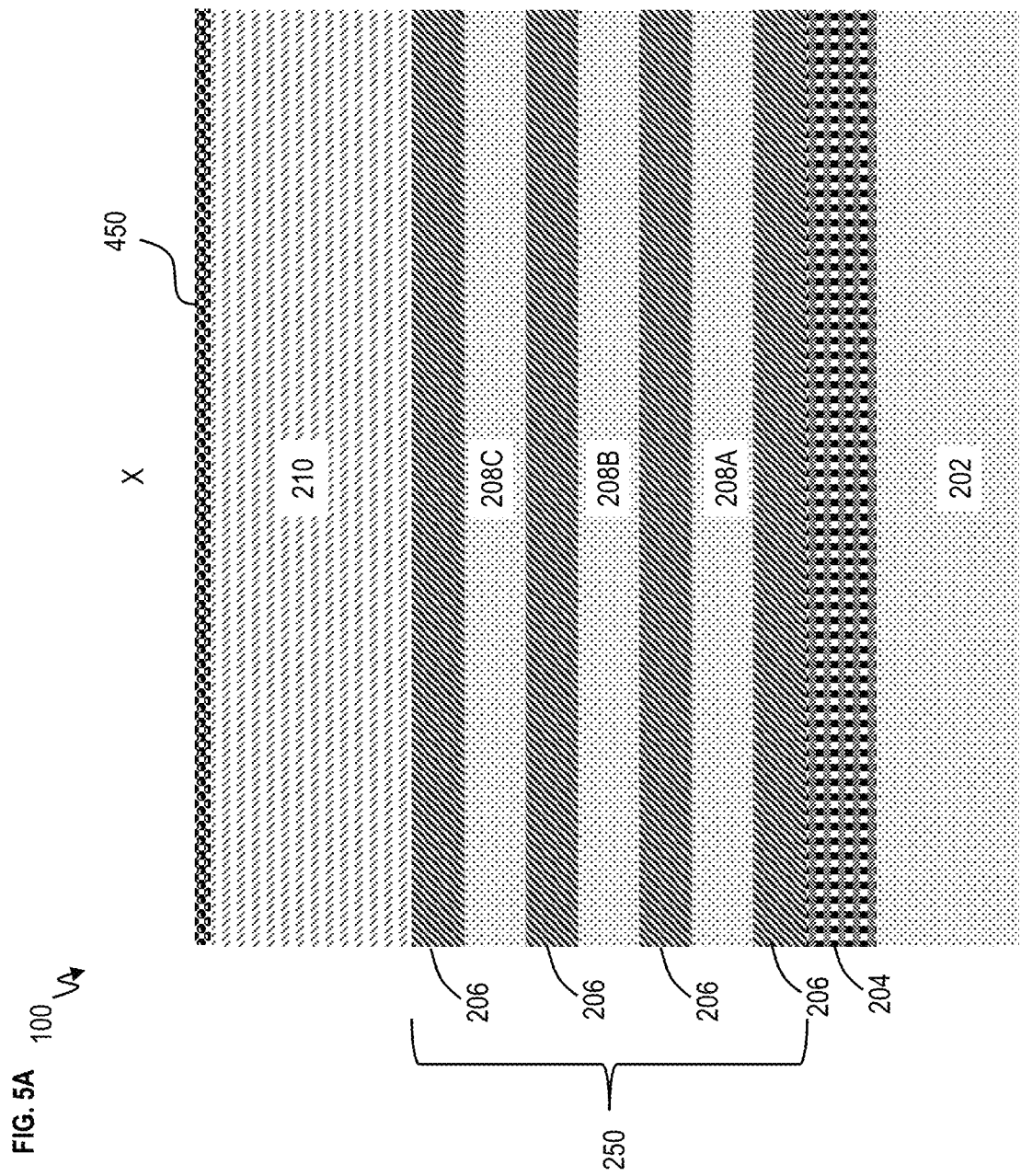
FIG. 5A depicts a cross-sectional view of the semiconductor device taken along line X (shown in FIG. 1) after fabrication operations according to embodiments of the invention.
Figure 5B:
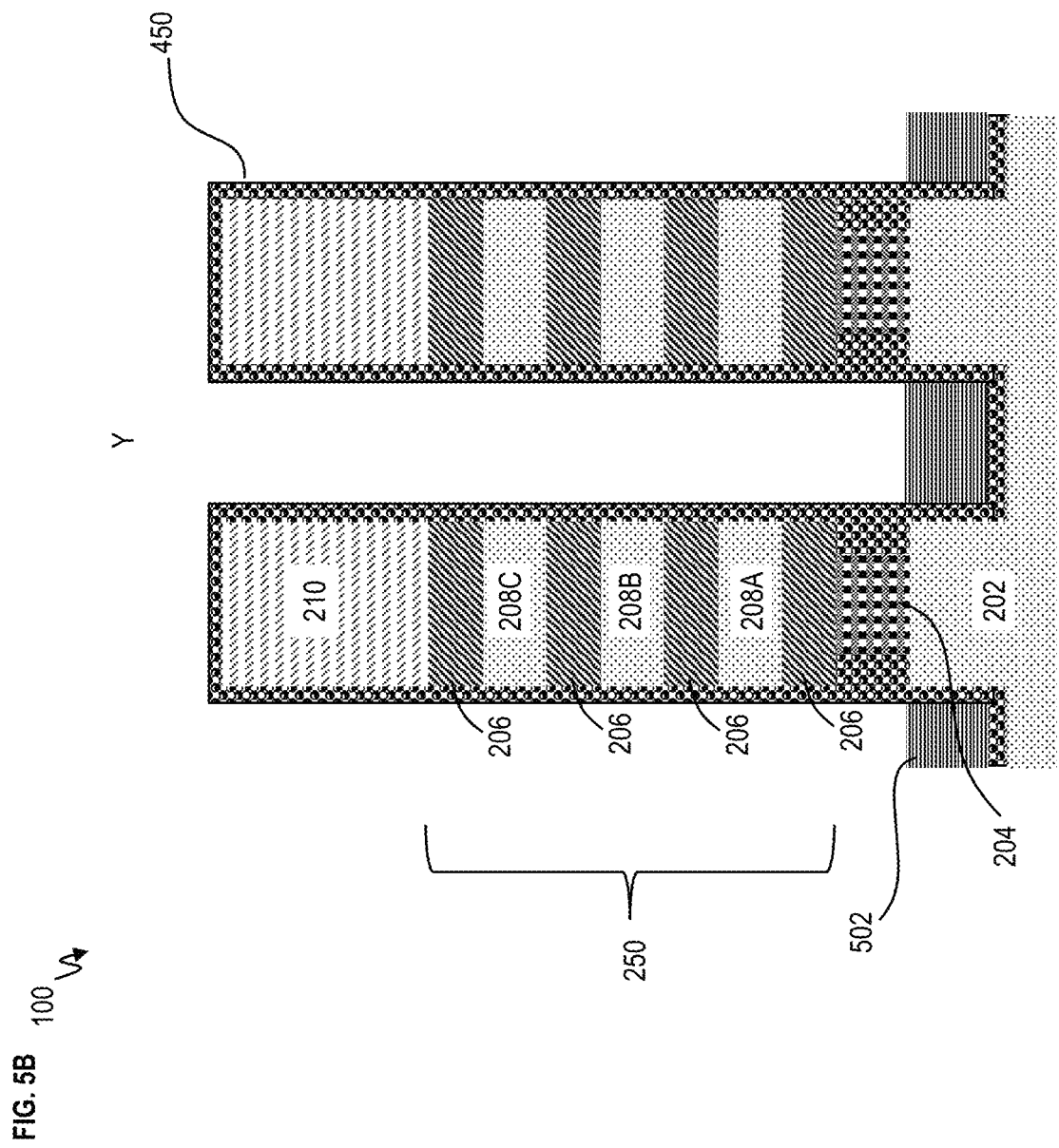
FIG. 5B depicts a cross-sectional view of the semiconductor device taken along line Y (shown in FIG. 1) after fabrication operations according to embodiments of the invention.

FIG. 5A depicts a cross-sectional view of the semiconductor device 100 taken along line X according to embodiments of the invention. FIG. 5B depicts a cross-sectional view of the semiconductor device 100 taken along line Y according to embodiments of the invention. FIG. 5B illustrates that shallow trench isolation regions (STI) 502 are formed in trenches previously etched during fin formation (shown in FIG. 2B). The material of the STI regions 502 can be an oxide. The oxide can be HDP oxide, FCVD oxide, etc. The material of the STI regions 502 is formed on the low-k dielectric liner 450. Chemical mechanical polishing/planarization is performed and stops on top of the low-k dielectric liner 450 and fin hardmask 210.

Figure 6B:
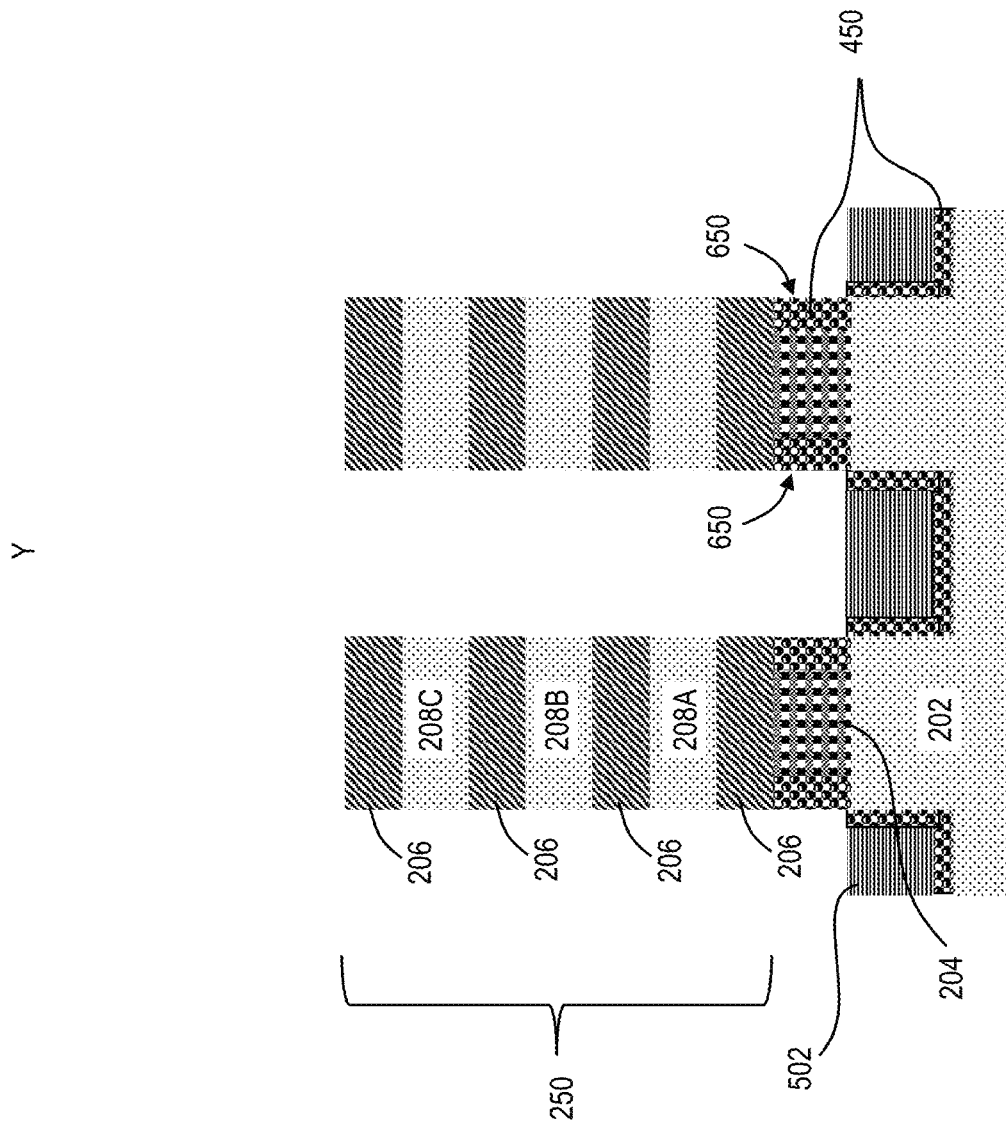
FIG. 6B depicts a cross-sectional view of the semiconductor device taken along line Y (shown in FIG. 1) after fabrication operations according to embodiments of the invention.

FIG. 6A depicts a cross-sectional view of the semiconductor device 100 taken along line X according to embodiments of the invention. FIG. 6B depicts a cross-sectional view of the semiconductor device 100 taken along line Y according to embodiments of the invention. Etching is performed to remove portions of the low-k dielectric liner 450 and the fin hard mask 210, while leaving the pinched off low-k dielectric liner 450 in the cavities/indentations 302 thereby forming inner spacers 650, as depicted in FIG. 6B. Also, the low-k dielectric liner 450 still lines the STI regions 502. Particularly, reactive ion etching (RIE) and a wet etch can be performed to remove the low-k dielectric liner 450 and fin hard mask 210. For example, hot phosphorous ($H_3PO_4$) can be used to remove, for example, the silicon nitride of the low-k dielectric liner 450 and fin hard mask 210 and thereby form the inner spacers 650.

Figure 7A:
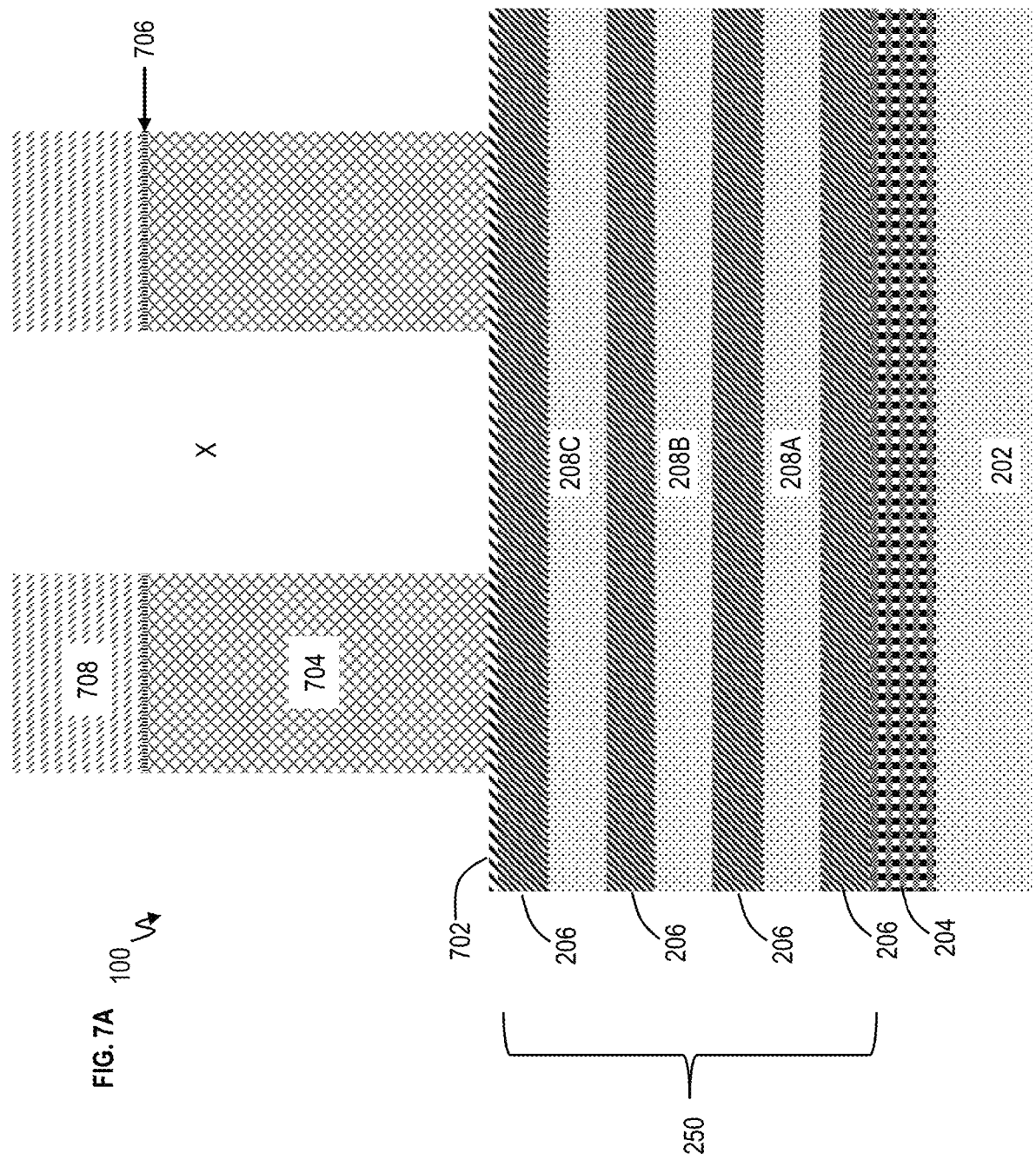
FIG. 7A depicts a cross-sectional view of the semiconductor device taken along line X (shown in FIG. 1) after fabrication operations according to embodiments of the invention.
Figure 7B:
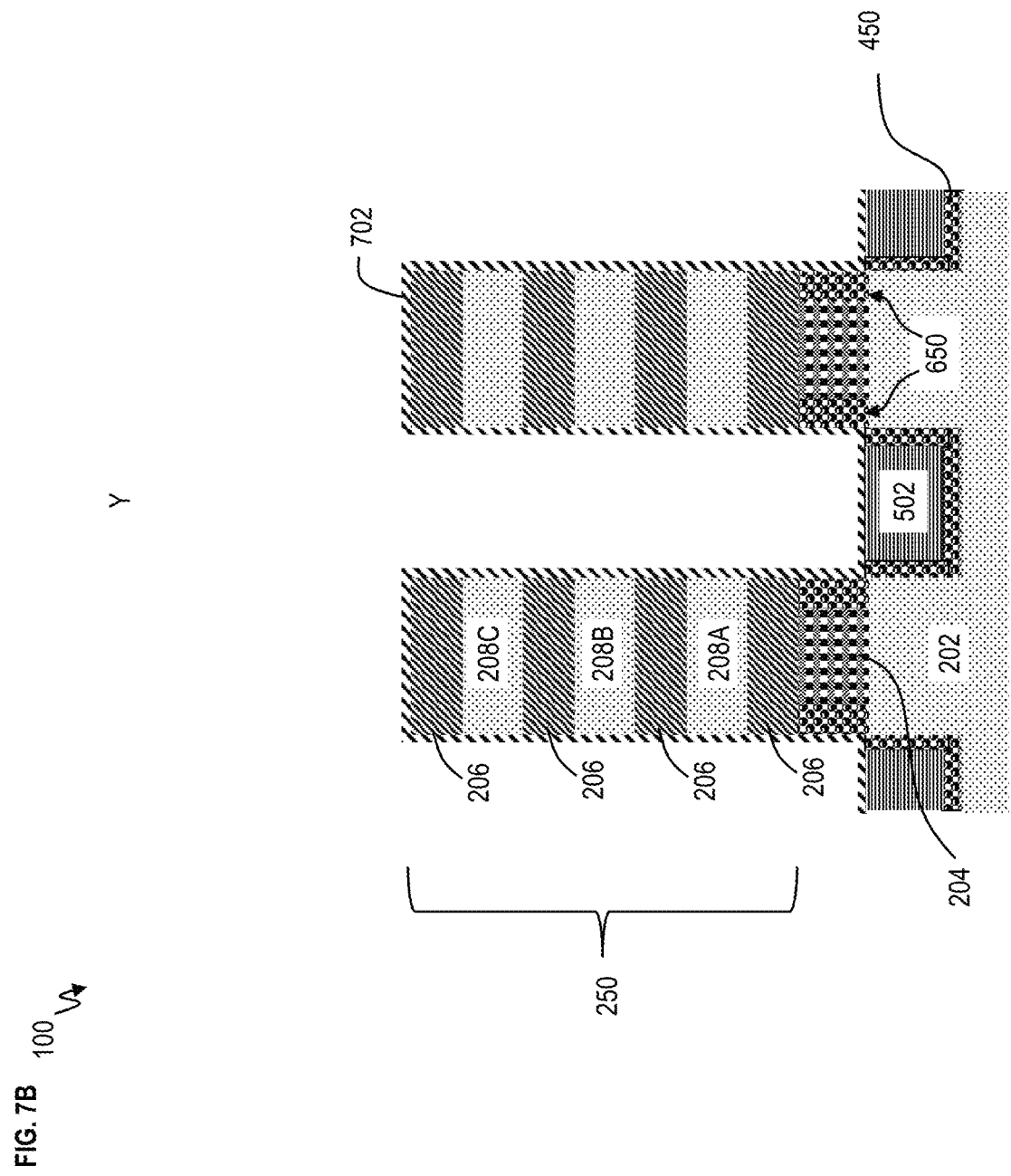
FIG. 7B depicts a cross-sectional view of the semiconductor device taken along line Y (shown in FIG. 1) after fabrication operations according to embodiments of the invention.

FIG. 7A depicts a cross-sectional view of the semiconductor device 100 taken along line X according to embodiments of the invention. FIG. 7B depicts a cross-sectional view of the semiconductor device 100 taken along line Y according to embodiments of the invention. A dummy dielectric layer 702 is formed on top of the upper sacrificial layer 206 as shown in FIG. 7A. FIG. 7B shows that the dummy dielectric layer 702 is formed on the stack 250, the low-k dielectric liner 450 including the inner spacers 650, and the STI material 602. The dummy dielectric layer 702 can be an oxide, such as, $SiO_2$. Dummy gates 704 are formed on top of the dummy dielectric layer 702 as seen in FIG. 7A. The dummy gates 704 can be formed by depositing dummy gate material, such as, amorphous silicon or polycrystalline silicon (poly silicon), on top of the dummy dielectric layer 702. A gate hard mask 708 is formed on the dummy gate material. The gate hard mask 708 can be a nitride, oxide, and/or a combination of nitride and oxide multi-layer. In some implementations, a pad oxide 706 can be deposited on the dummy dielectric layer 702 prior to forming the gate hard mask 708. Gate patterning is formed by patterning the gate hard mask 708 and then using the patterned gate hard mask 708 to etch the dummy gate material into the dummy gates 704, as seen in FIG. 7A.

Figure 8A:
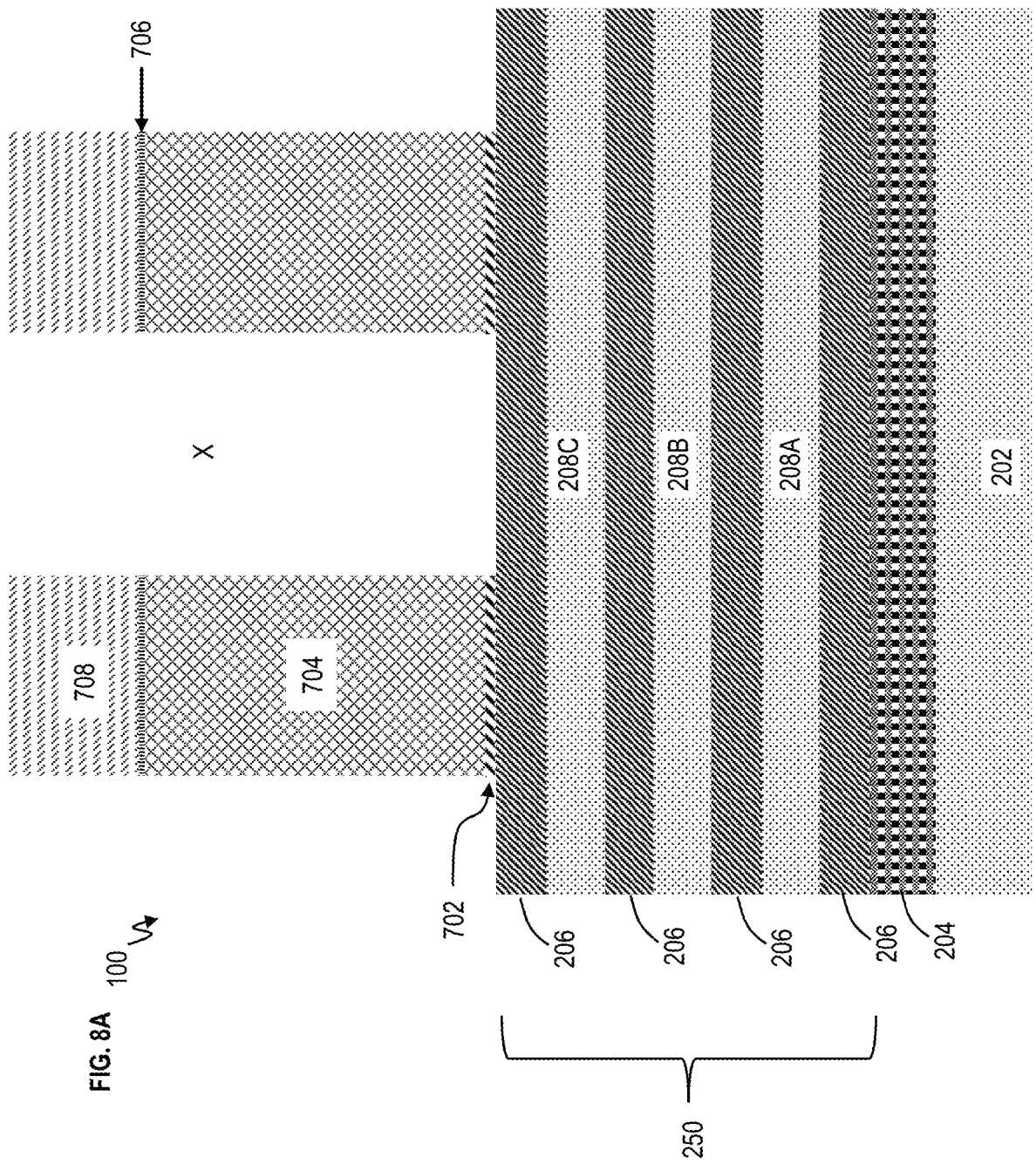
FIG. 8A depicts a cross-sectional view of the semiconductor device taken along line X (shown in FIG. 1) after fabrication operations according to embodiments of the invention.
Figure 8B:
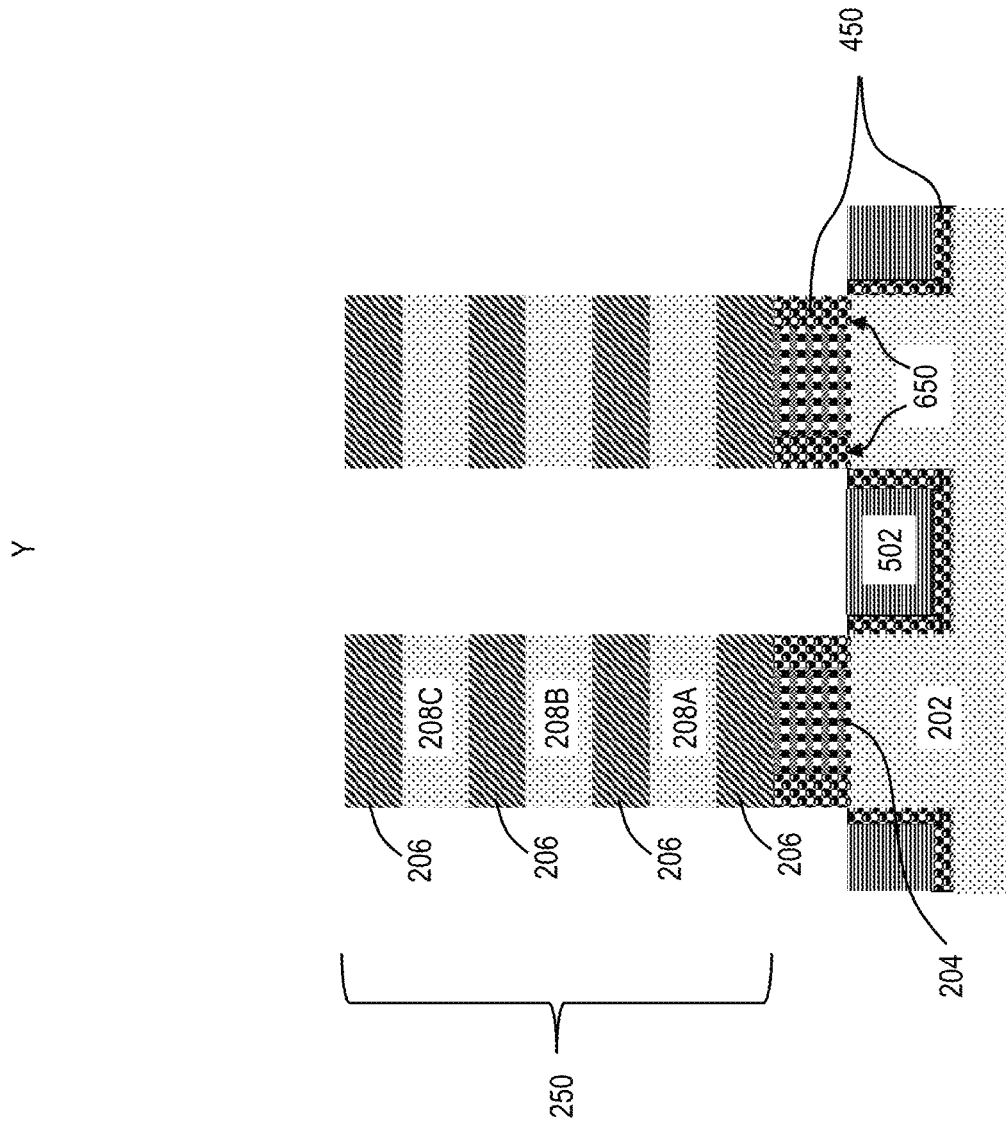
FIG. 8B depicts a cross-sectional view of the semiconductor device taken along line Y (shown in FIG. 1) after fabrication operations according to embodiments of the invention.

FIG. 8A depicts a cross-sectional view of the semiconductor device 100 taken along line X according to embodiments of the invention. FIG. 8B depicts a cross-sectional view of the semiconductor device 100 taken along line Y according to embodiments of the invention. Portions of the dummy dielectric layer 702 not protected under the gate hard mask 708 are etched, while the protected portions remain as seen in FIG. 8A. FIG. 8B shows that the dummy dielectric layer 702 is etched from the stack 250 and the STI regions 602.

Figure 9B:
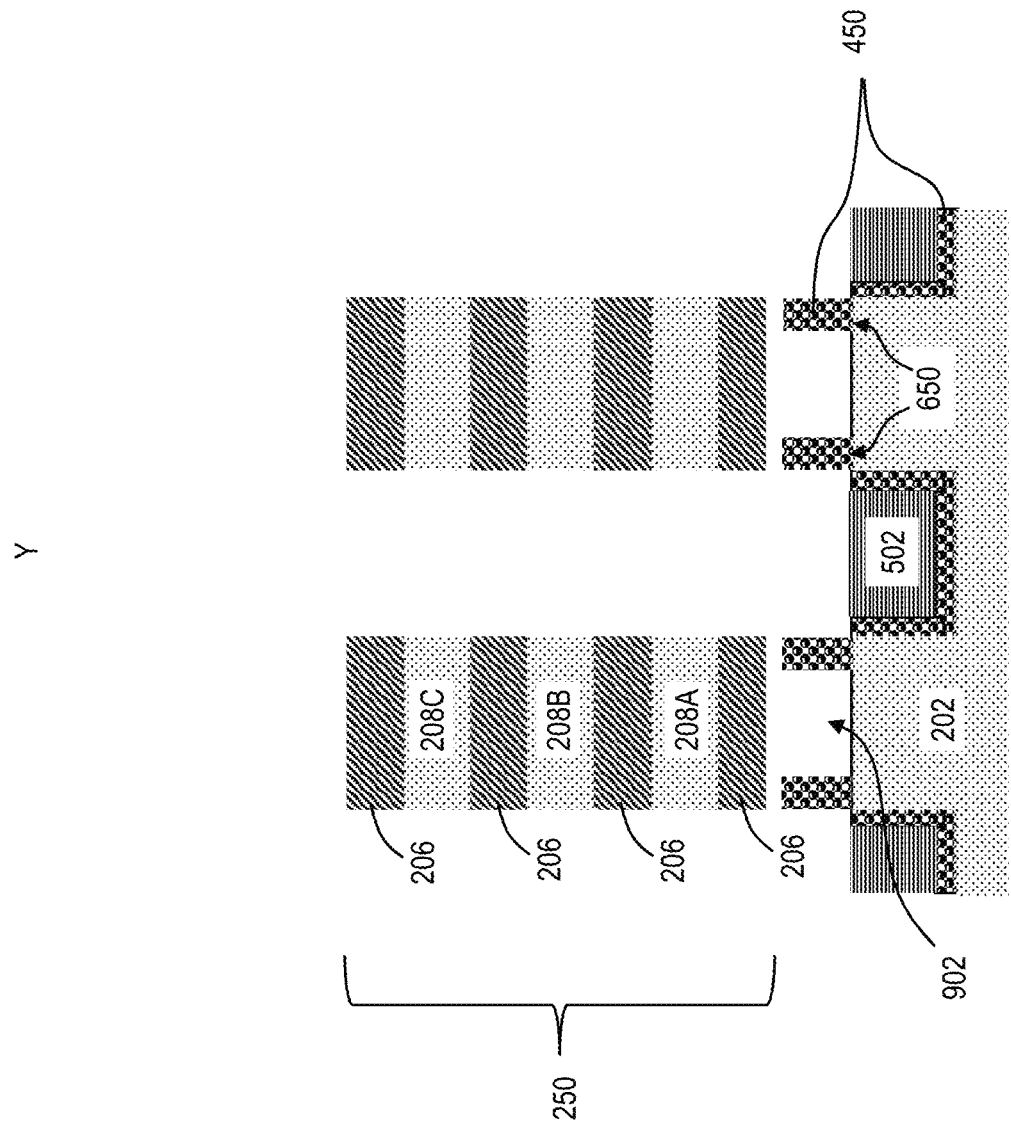
FIG. 9B depicts a cross-sectional view of the semiconductor device taken along line Y (shown in FIG. 1) after fabrication operations according to embodiments of the invention.

FIG. 9A depicts a cross-sectional view of the semiconductor device 100 taken along line X according to embodiments of the invention. FIG. 9B depicts a cross-sectional view of the semiconductor device 100 taken along line Y according to embodiments of the invention. Selective etch of the sacrificial bottom isolation layer 204 is performed which creates openings 902, shown in FIGS. 9A and 9B. The openings 902 are under the bottom most sacrificial layer 206 and above the substrate 202.

The sacrificial bottom isolation layer 204 is now removed, and the selective etch of the sacrificial bottom isolation layer 204 (e.g., $SiGe_{y\%}$) does not remove the other layers, particularly sacrificial layers 206 (e.g., $SiGe_{x\%}$) and channel layer 208. Although both the sacrificial bottom isolation layer 204 and sacrificial layers 206 can be SiGe, the concentration or atomic percent of Ge is more in the sacrificial bottom isolation layer 204 than in the sacrificial layers 206 such that sacrificial bottom isolation layer 204 is etched without etching the sacrificial layers 206. An example etchant can be HCl or $ClF_3$.

Although the layers above the openings 902 appear to be floating, it is noted that the layers (including the nanosheet stack 250) are anchored to the dummy gates 704. The openings 902 are created in preparation for a bottom dielectric isolation layer which is to isolate the source and drain regions as discussed herein. As one suitable example, the y of $SiGe_{y\%}$ of the sacrificial bottom isolation layer 204 can be about 60 atomic percent while the x of $SiGe_{x\%}$ of the sacrificial layers 206 can be about 25 atomic percent. Optionally, in some embodiments of the invention, the bottom sacrificial layer 206 can be intentionally etched to ensure that the sacrificial bottom isolation layer 204 is fully etched, which can additionally create a small space above the inner spacer 650, as shown in FIG. 9B.

Figure 10B:
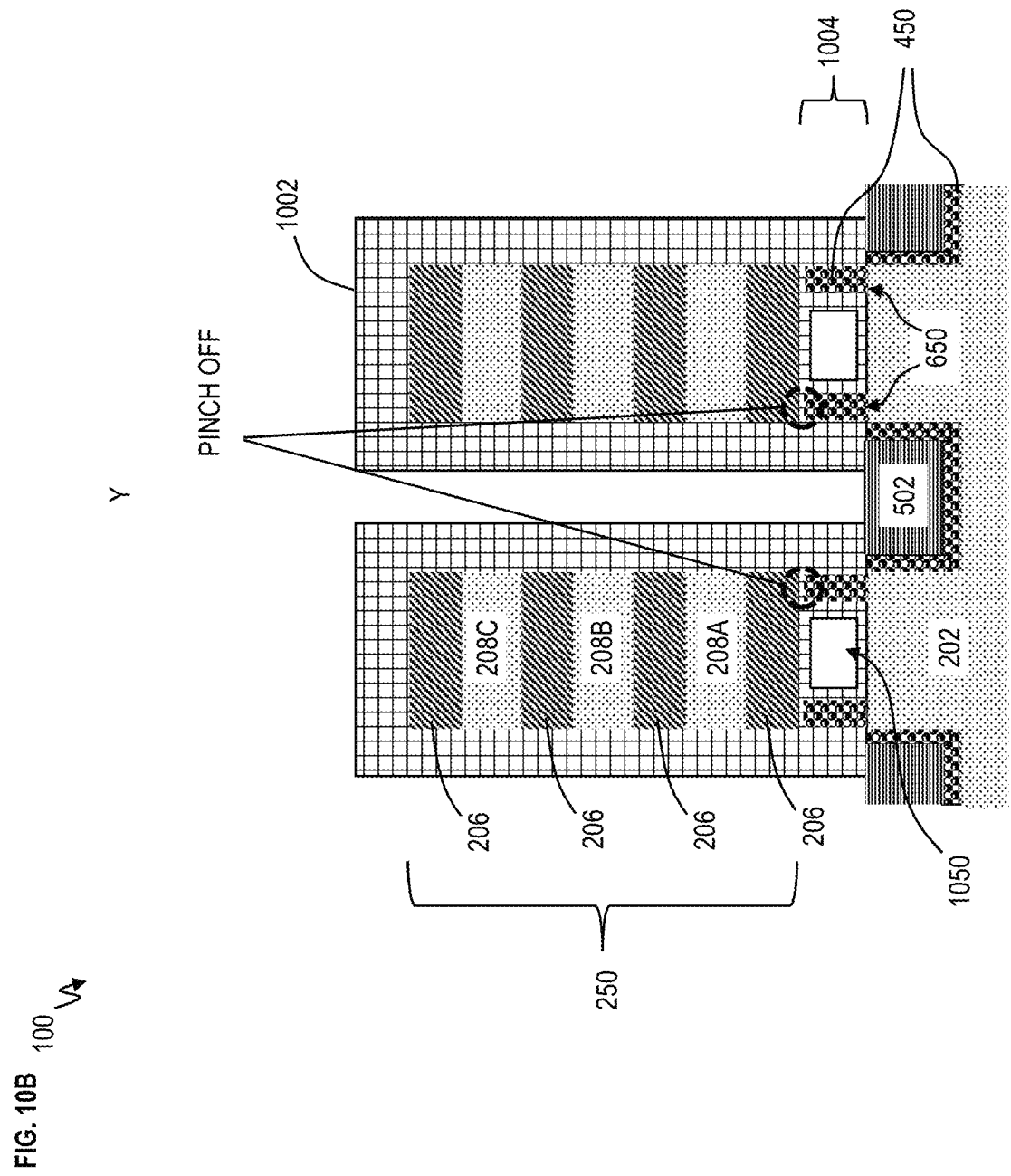
FIG. 10B depicts a cross-sectional view of the semiconductor device taken along line Y (shown in FIG. 1) after fabrication operations according to embodiments of the invention

FIG. 10A depicts a cross-sectional view of the semiconductor device 100 taken along line X according to embodiments of the invention. FIG. 10B depicts a cross-sectional view of the semiconductor device 100 taken along line Y according to embodiments of the invention. Conformal deposition of low-k spacer material 1002 is performed which simultaneously forms bottom dielectric isolation layer 1004. The low-k spacer material 1002 is the isolation layer as will be seen more clearly herein. The low-k spacer material 1002 is formed in and pinches off the openings 902 thereby forming air gaps 1050. Pinch off to form the air gaps 1050 can be seen in FIG. 10B, which then causes a small pocket (i.e., air gap 1050) to be formed between the inner spacers 650 (also between the bottom most sacrificial layer 206 and the substrate 202). The low-k spacer material 1002 is also formed on the dummy gate 704 and gate hard mask 708. The low-k spacer material 1002 can be, for example, silicon boron carbide nitride (SiBCN). Other examples of the low-k spacer material 1002 can include SiO, SiOC, SiOCN, etc. The bottom dielectric isolation layer 1004 is the same height H1 as the previous sacrificial bottom isolation layer 204 which was removed to create opening/space 902. The bottom dielectric isolation layer 1004 is underneath bottom most sacrificial layer 206 but above the substrate 202.

Figure 11A:
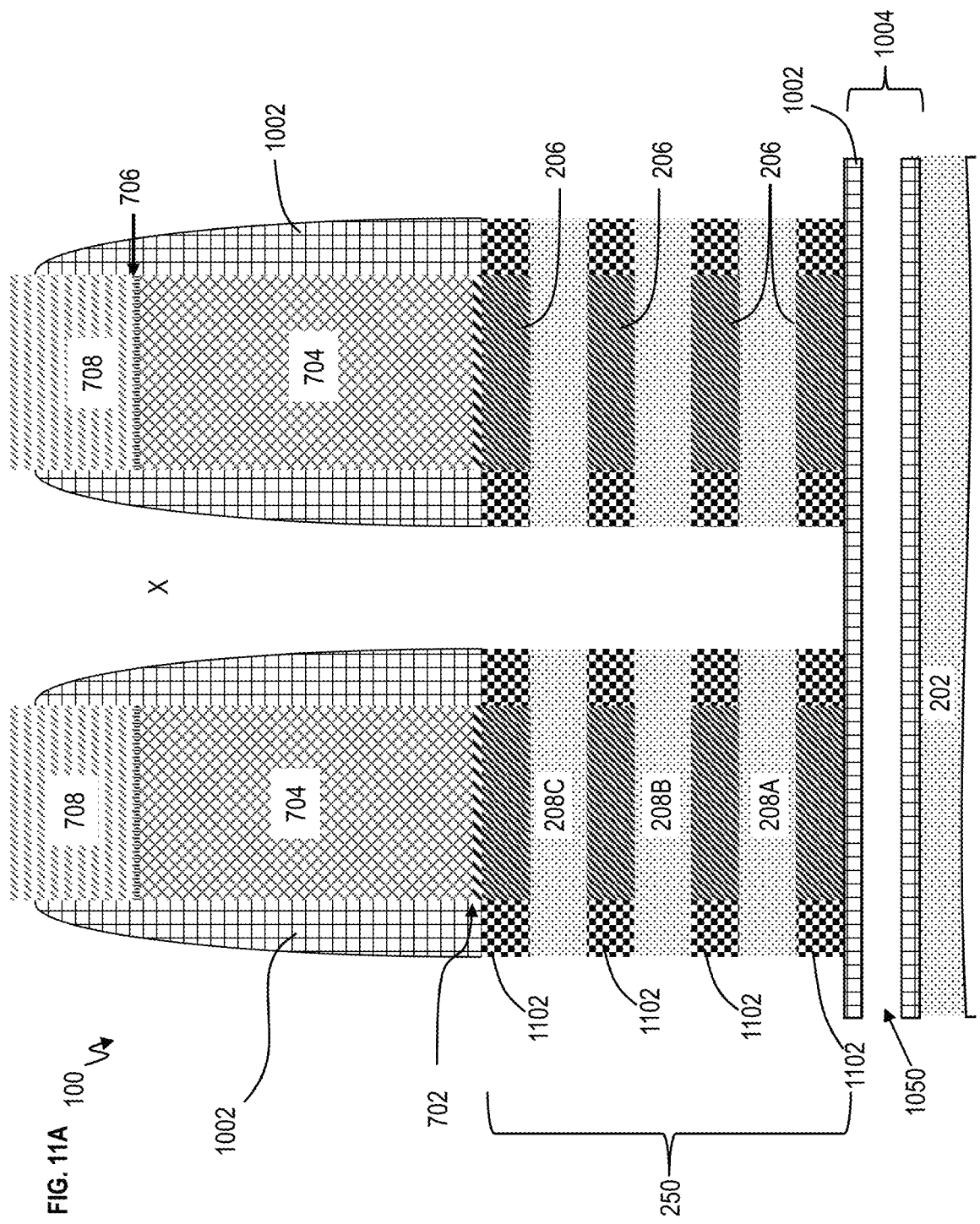
FIG. 11A depicts a cross-sectional view of the semiconductor device taken along line X (shown in FIG. 1) after fabrication operations according to embodiments of the invention.

FIG. 11A depicts a cross-sectional view of the semiconductor device 100 taken along line X according to embodiments of the invention. FIG. 11B depicts a cross-sectional view of the semiconductor device 100 taken along line Y according to embodiments of the invention. Anisotropic spacer recess is performed using, for example, a directional RIE. This recesses the low-k spacer material 1002 on the edges of the dummy gates 704 as shown in FIG. 11A and on the edges of the nanosheet stack 250 as shown in FIG. 11B. Also, a portion of the low-k spacer material 1002 is removed from the STI material regions 502. Using the gate hard mask 708 and the low-k spacer material 1002 as a mask, an anisotropic fin recess is performed to recess/trim portions of the nanosheet stack 250 which are not protected as shown in FIG. 11A. The anisotropic fin recess removed the nanosheet stack 250 in FIG. 11B. Directional RIE can be used during the fin recess. The bottom dielectric isolation layer 1102 provides an etch stop for the fin recess, such that there is no substrate 202 over etch. In other words, the bottom dielectric isolation layer 1102 protects the substrate 202 during the fin etch.

Further, inner spacers 1102 are formed as seen in FIG. 11A. For example, indentation of the sacrificial layers 206 is performed while etching selectively the sacrificial suspension layers 206 to the channel layers 208. As one example sufficient to etch the sacrificial layers 206 while not etching the channel layers 208, the sacrificial layers 206 can be $SiGe_{25\%}$ (e.g., the atomic percent for Ge is 25%) and the channel layers 208 can be Si. Indent cavities (not shown) are created from removing end portions of the sacrificial layers 206. The indent cavities are aligned to the bottom portions of the low-k spacer material 1002 on the dummy gates 704. Conformal deposition of a dielectric material (e.g., low-k dielectric material) is performed to pinch off the indent cavities. An isotropic etch back (using a wet or dry process) of the dielectric material is performed to thereby form the inner spacers 1102 inside the indent cavities. The low-k dielectric material of the inner spacers 1102 can be a nitride based material.

Figure 12B:
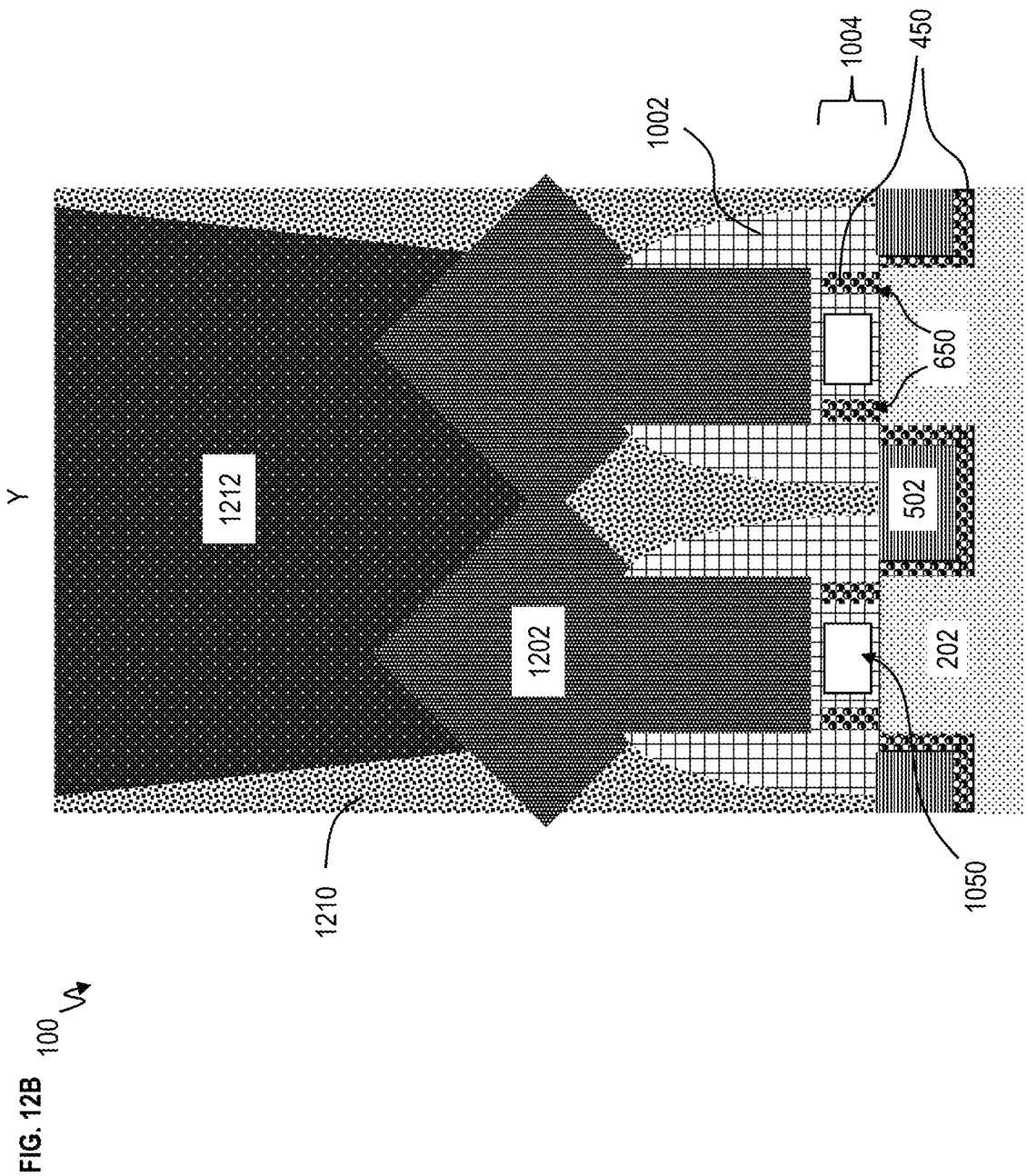
FIG. 12B depicts a cross-sectional view of the semiconductor device taken along line Y (shown in FIG. 1) after fabrication operations according to embodiments of the invention.

FIG. 12A depicts a cross-sectional view of the semiconductor device 100 taken along line X according to embodiments of the invention. FIG. 12B depicts a cross-sectional view of the semiconductor device 100 taken along line Y according to embodiments of the invention. Formation of source or drain epitaxy regions 1202 is performed. The source or drain epitaxy 1202 can be NFET source/drain epitaxial regions or PFET source/drain epitaxial regions according to formation of the NFET or PFET devices. Accordingly, the source or drain epitaxial regions 1202 can be doped with N-type dopants or P-type dopants as desired. The source or drain epitaxy 1202 can be epitaxially grown from the edges of the channel layers 208.

An inter-level dielectric (ILD) material 1210 is then deposited to cap the Source-Drain epitaxy. The ILD material 1210 is a low-k dielectric material such as, for example, an oxide material like silicon dioxide. The ILD material 1210 is then recessed by chemical mechanical polishing (CMP) until the gate hardmask layer 708 is reached.

Further, a replacement metal gate (RMG) process is performed. First, the gate hard mask 708 and pad oxide 706 are removed. An etch is then performed to selectively remove the dummy gate 704, the dummy dielectric layer 702 (etched), and finally the sacrificial suspension layers 206 are selectively etched to release the channel layers 208. The selective etch of the sacrificial suspension layers 206 creates openings between the channel layers 208. Conformal high-k metal gate (HKMG) formation is then performed to deposit HKMG layers 1204 which fill the previous locations of the sacrificial layers 206, so as to wrap around the channel layers 208. Optionally, a metal layer 1206 can be formed on the HKMG layers 1204. The metal layer 1206 can include tungsten (W). A self-aligned contact (SAC) cap 1208 is formed on top of the HKMG layers 1204 and metal layer 1206 (if formed). The SAC cap 1208 is an insulating material, such as, a nitride (e.g., SiN), an oxide (e.g., $SiO_2$), etc.

Trench contact formation is performed in the ILD material 1210 over the source and drain epitaxy 1202, and the source and drain contacts 1212 are formed. The source and drain contacts 1212 can be referred to as trench silicide (TS) contacts. The material of the source and drain contacts 1212 can include one or more layers. The source and drain contacts 1212 can be a Ti/TiN stack in which the titanium (Ti) is deposited first and titanium nitride (TiN) second. Other materials of the source and drain contacts 1012 can be tungsten (W) for instance.

Techniques for forming HKMG in gate openings are well-known in the art and, thus, the details have been omitted in order to allow the reader to focus on the salient aspects of the disclosed methods. However, it should be understood that such HKMG will generally include formation of one or more gate dielectric layers (e.g., an inter-layer (IL) oxide and a high-k gate dielectric layer), which are deposited so as to line the gate openings, and formation of one or more metal layers, which are deposited onto the gate dielectric layer(s) so as to fill the gate openings. The materials and thicknesses of the dielectric and metal layers used for the HKMG can be preselected to achieve desired work functions given the conductivity type of the FET. To avoid clutter in the drawings and to allow the reader to focus on the salient aspects of the disclosed methods, the different layers within the HKMG stack 1204 are not illustrated. For explanation purposes, a high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the nanosheet-FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal alloy.

Figure 13A:
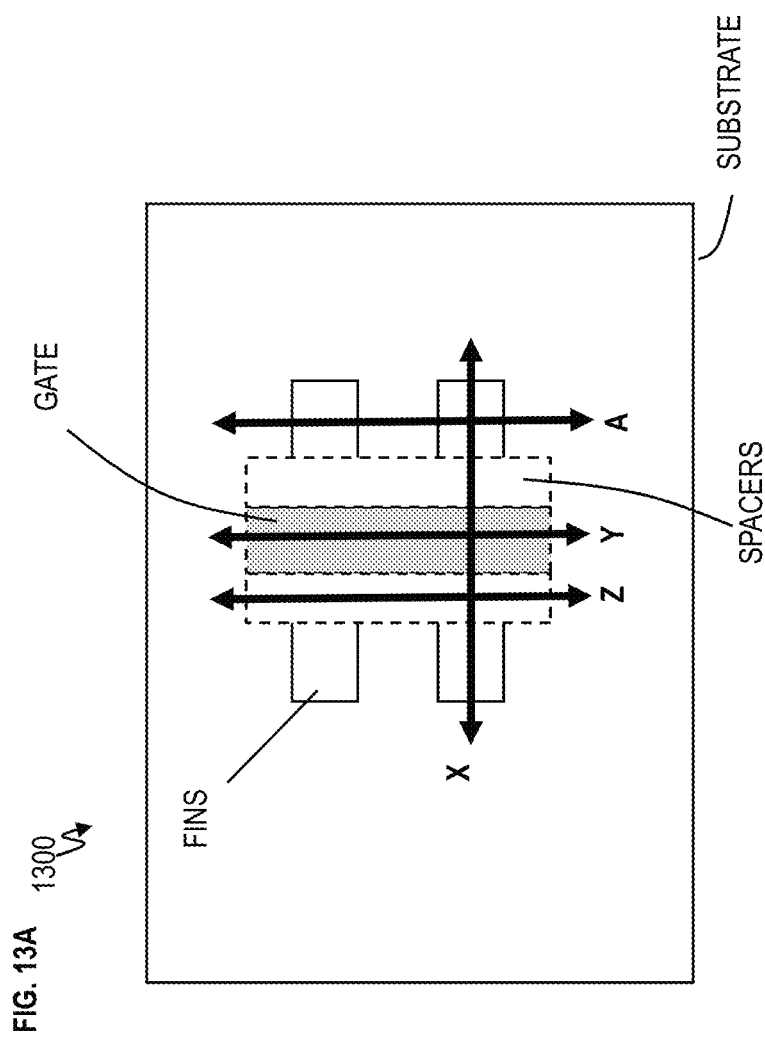
FIG. 13A depicts a simple diagram of a top view of a semiconductor device according to embodiments of the invention.
Figure 13B:
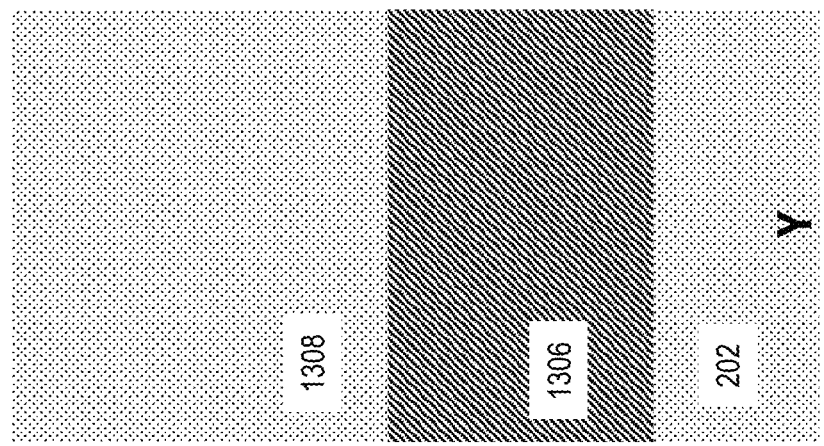
FIG. 13B depicts a cross-sectional view of the semiconductor device taken along line Y (shown in FIG. 13A) after fabrication operations according to embodiments of the invention.

It should be appreciated that various modifications can be made to the integration method of forming a full bottom dielectric isolation of the nanosheet FET. Now turning to further techniques of forming the full bottom dielectric isolation for a FinFET 1300, it is noted that previous discussions of the nanosheet FET 100 apply by analogy to formation of the FinFET 1300. FIG. 13A depicts a simple diagram of a top-down view of a semiconductor device 1300 (e.g., FinFET) according to embodiments of the invention. FIG. 13A is only for reference and illustrates locations of the future fins, gate, and gate spacers. For simplicity and ease of understanding, FIG. 13A omits some layers (elements) so as to not obscure the figure. FIG. 13B depicts a cross-sectional view of the semiconductor device 1300 shown in FIG. 13A taken along line Y according to embodiments of the invention. A sacrificial layer 1306 is epitaxially grown on the substrate 202. The height of sacrificial layer 1306 can be about 5 nm to 40 nm. The sacrificial layer 1306 can be $SiGe_x$ % (e.g., x between about 15% to 35%), and discussion of materials for the sacrificial layer 206 can apply by analogy to the sacrificial layer 1306. A channel layer 1308 is epitaxially grown on the sacrificial layer 1306. The channel layer 1308 can be, for example, silicon. The channel layer 1308 will be formed into one or more fins.

Figure 14:
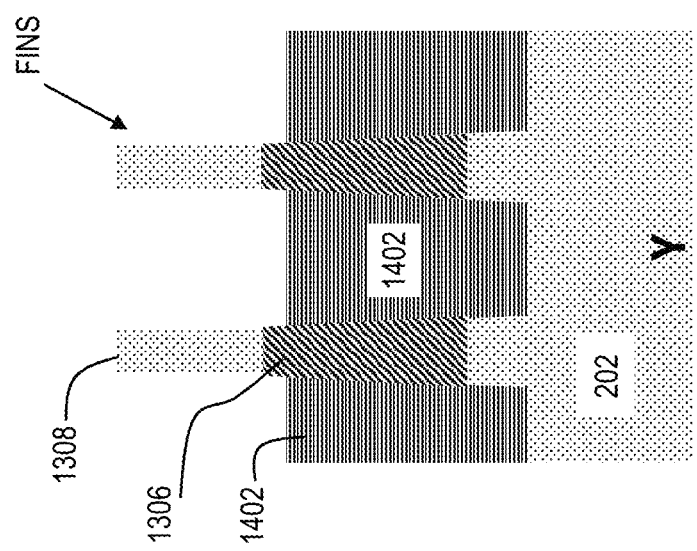
FIG. 14 depicts a cross-sectional view of the semiconductor device taken along line Y (shown in FIG. 13A) after fabrication operations according to embodiments of the invention.

FIG. 14 depicts a cross-sectional view of the semiconductor device 1300 shown in FIG. 13A taken along line Y according to embodiments of the invention. FIG. 14 shows that the channel layer 1308 has been formed into one or more fins. For example, a hard mask layer (not shown) can be formed on top of the sacrificial layer 1306. The hard mask layer can be patterned, and etching is performed to form the channel layer 1308 and sacrificial layer 1306 into fin shapes. The fin formation results in part of the substrate 202 being etched, such that small trenches are formed in the substrate 202. Shallow trench isolation regions 1402 are formed by depositing STI material. The material of the STI regions 1402 can be an oxide. The oxide can be HDP oxide, FCVD oxide, etc. The material of the STI regions 1402 is formed on the substrate 202.

Figure 15B:
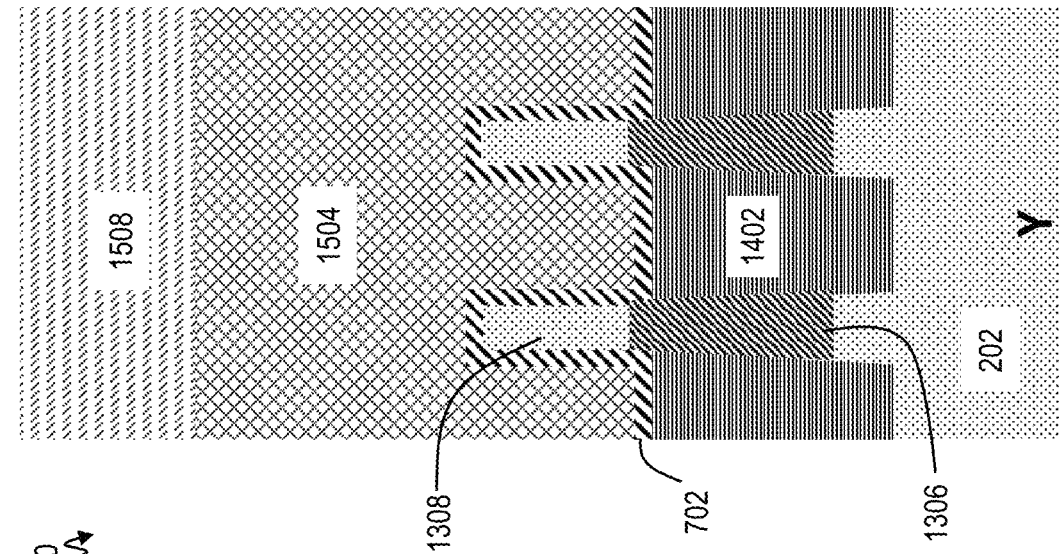
FIG. 15B depicts a cross-sectional view of the semiconductor device taken along line Y (shown in FIG. 13A) after fabrication operations according to embodiments of the invention.
Figure 15A:
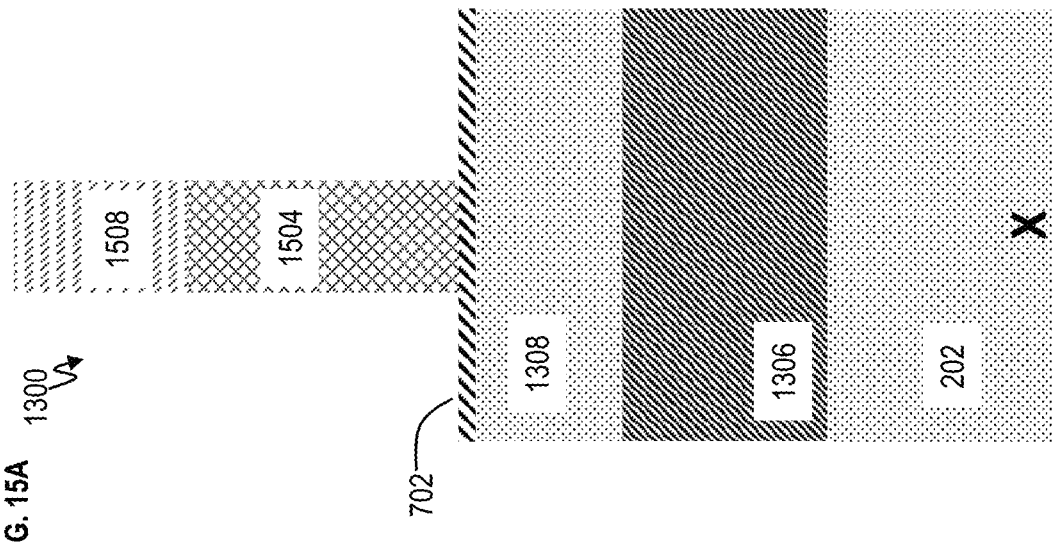
FIG. 15A depicts a cross-sectional view of the semiconductor device taken along line X (shown in FIG. 13A) after fabrication operations according to embodiments of the invention.
Figures 15C, 15D:
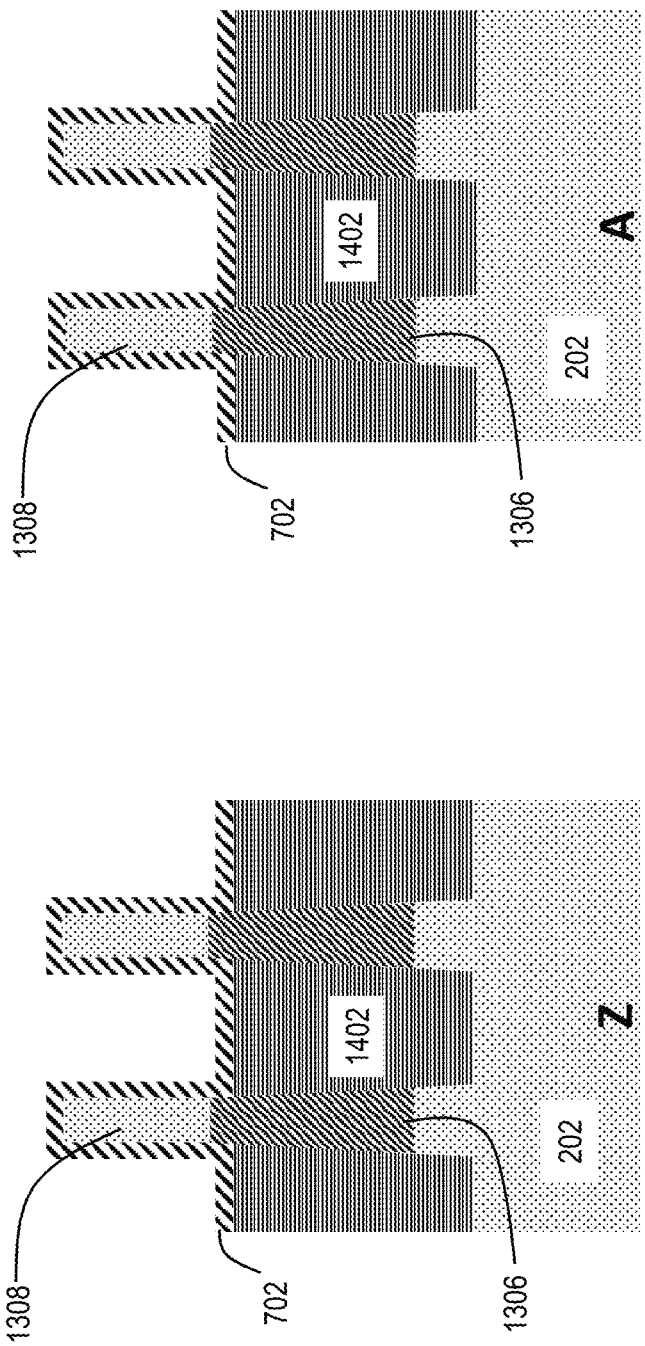
FIG. 15C depicts a cross-sectional view of the semiconductor device taken along line Z (shown in FIG. 13A) after fabrication operations according to embodiments of the invention.
FIG. 15D depicts a cross-sectional view of the semiconductor device taken along line A (shown in FIG. 13A) after fabrication operations according to embodiments of the invention.

FIG. 15A depicts a cross-sectional view of the semiconductor device 1300 shown in FIG. 13A taken along line X according to embodiments of the invention. FIG. 15B depicts a cross-sectional view of the semiconductor device 1300 shown in FIG. 13A taken along line Y according to embodiments of the invention. FIG. 15C depicts a cross-sectional view of the semiconductor device 1300 shown in FIG. 13A taken along line Z according to embodiments of the invention. FIG. 15D depicts a cross-sectional view of the semiconductor device 1300 shown in FIG. 13A taken along line Z according to embodiments of the invention. Dummy dielectric deposition, gate patterning, and gate formation are performed.

In forming the semiconductor device 1300, a dummy dielectric layer 702 is formed on top of channel layer 1308 as shown in FIGS. 15A, 15B, 15C, and 15D. Additionally, FIGS. 15B, 15C, and 15D show that the dummy dielectric layer 702 is formed on the STI regions 1402 and portions of the sacrificial layer 1306. The dummy dielectric layer 702 can be an oxide, such as, $SiO_2$. Dummy gate 1504 is formed on top of the dummy dielectric layer 702 as seen in FIGS. 15A and 15B. The dummy gate 1504 can be formed by depositing dummy gate material, such as, amorphous silicon or polycrystalline silicon (poly silicon), on top of the dummy dielectric layer 702. A gate hard mask 1508 is formed on the dummy gate material. The gate hard mask 1508 can be a nitride, an oxide, and/or a combination nitride and oxide multi-layer. Dummy gate patterning is formed by patterning the gate hard mask 1508 and then using the patterned gate hard mask 1508 to etch the dummy gate material into the dummy gate 1504, as seen in FIGS. 15A and 15B.

Figure 16B:
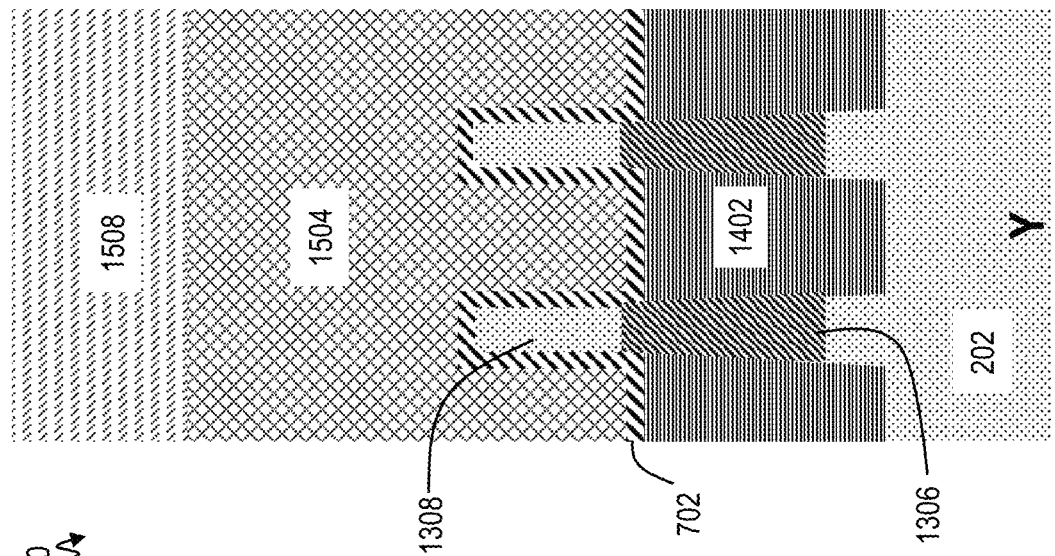
FIG. 16B depicts a cross-sectional view of the semiconductor device taken along line Y (shown in FIG. 13A) after fabrication operations according to embodiments of the invention.
Figure 16A:
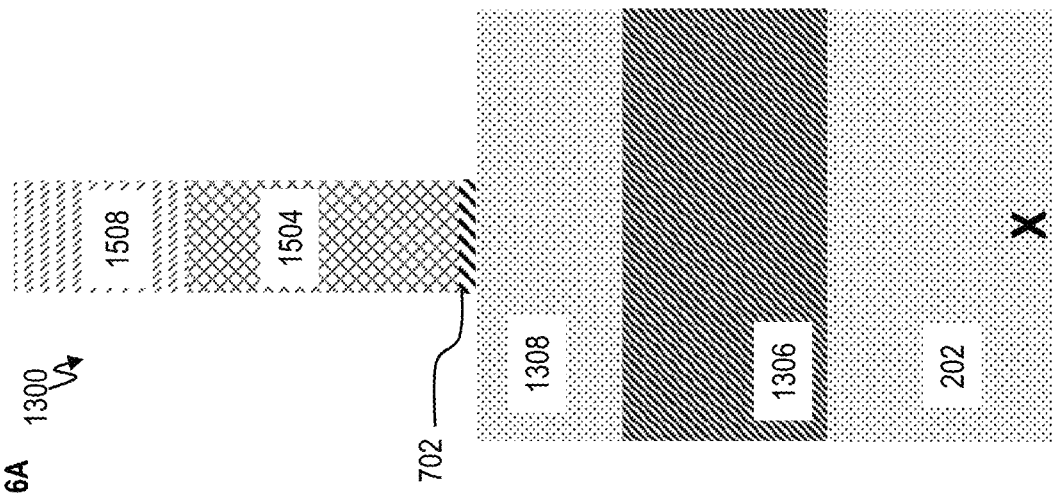
FIG. 16A depicts a cross-sectional view of the semiconductor device taken along line X (shown in FIG. 13A) after fabrication operations according to embodiments of the invention.

FIG. 16A depicts a cross-sectional view of the semiconductor device 1300 shown in FIG. 13A taken along line X according to embodiments of the invention. FIG. 16B depicts a cross-sectional view of the semiconductor device 1300 shown in FIG. 13A taken along line Y according to embodiments of the invention. FIG. 16C depicts a cross-sectional view of the semiconductor device 1300 shown in FIG. 13A taken along line Z according to embodiments of the invention. FIG. 16D depicts a cross-sectional view of the semiconductor device 1300 shown in FIG. 13A taken along line Z according to embodiments of the invention. Exposed portions of the dummy dielectric layer 702 are removed. The protected dummy dielectric layer 702 remains in FIGS. 16A and 16B under the dummy gate 1504.

FIG. 17A depicts a cross-sectional view of the semiconductor device 1300 shown in FIG. 13A taken along line X according to embodiments of the invention. FIG. 17B depicts a cross-sectional view of the semiconductor device 1300 shown in FIG. 13A taken along line Y according to embodiments of the invention. FIG. 17C depicts a cross-sectional view of the semiconductor device 1300 shown in FIG. 13A taken along line Z according to embodiments of the invention. FIG. 17D depicts a cross-sectional view of the semiconductor device 1300 shown in FIG. 13A taken along line Z according to embodiments of the invention. Analogous to FIGS. 9A and 9B discussed above, a selective etch of the sacrificial layer 1306 is performed.

Selective etch of the sacrificial layer 1306 creates openings 1702, shown in FIGS. 17A, 17B, 17C, and 17D. The openings 1702 are under the channel layer 1308 (i.e., fins) and above the substrate 202. The sacrificial layer 1306 is now removed, and the selective etch of the, for example, $SiGe_{x\ \%}$ (e.g., x between about 15% to 35%) does not remove the other layers, particularly channel layer 1308. Although the layers above the openings 1702 can appear to be floating, it is noted that the layers (including channel layer 1308) are anchored to the dummy gate 1504. The openings 1702 are created in preparation for a bottom dielectric isolation layer which is to isolate the source and drain regions as discussed herein.

Figure 18D:
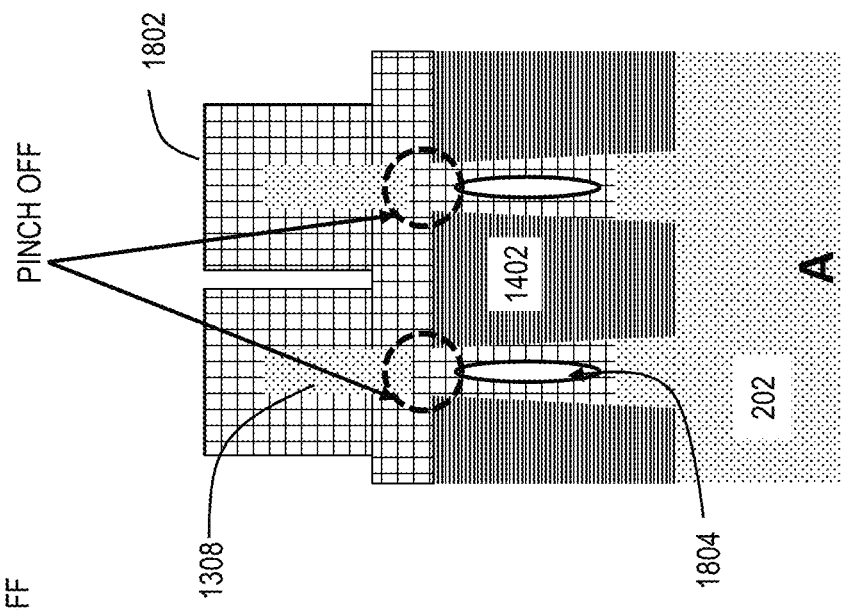
FIG. 18D depicts a cross-sectional view of the semiconductor device taken along line A (shown in FIG. 13A) after fabrication operations according to embodiments of the invention.
Figure 18C:
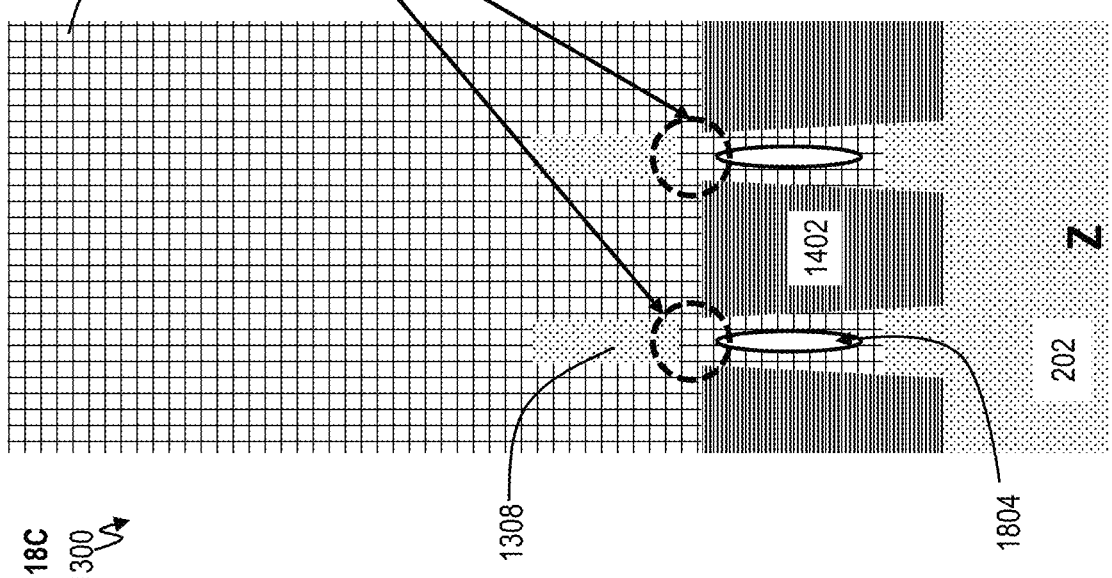
FIG. 18C depicts a cross-sectional view of the semiconductor device taken along line Z (shown in FIG. 13A) after fabrication operations according to embodiments of the invention.

FIG. 18A depicts a cross-sectional view of the semiconductor device 1300 shown in FIG. 13A taken along line X according to embodiments of the invention. FIG. 18B depicts a cross-sectional view of the semiconductor device 1300 shown in FIG. 13A taken along line Y according to embodiments of the invention. FIG. 18C depicts a cross-sectional view of the semiconductor device 1300 shown in FIG. 13A taken along line Z according to embodiments of the invention. FIG. 18D depicts a cross-sectional view of the semiconductor device 1300 shown in FIG. 13A taken along line Z according to embodiments of the invention. Analogous to FIGS. 10A and 10B discussed above, conformal deposition of low-k spacer material 1802 is performed which simultaneously forms bottom dielectric isolation, as depicted in FIGS. 18A, 18B, 18C, and 18D. The low-k spacer material 1802 is formed in and pinches off the openings 1702 thereby forming air gaps 1804. More particularly, early pinch off or sealing by the deposition of low-k spacer material 1802 (as best seen in FIGS. 18B, 18C, and 18D) causes a small pocket (i.e., air gap 1804) to remain in the low-k spacer material 1802 without completely filling in the previous opening 1702. The dashed circles in FIGS. 18C and 18D represent early pinch off in the fin regions. The low-k spacer material 1802 is also formed on the substrate 202, channel layer 1308 (i.e., fins), STI regions 1402, dummy gate 1504, and gate hard mask 1508. The low-k spacer material 1802 can be, for example, silicon boron carbide nitride (SiBCN). Other examples of the low-k spacer material 1802 can include SiO, SiOC, SiOCN, etc.

FIG. 19A depicts a cross-sectional view of the semiconductor device 1300 shown in FIG. 13A taken along line X according to embodiments of the invention. FIG. 19B depicts a cross-sectional view of the semiconductor device 1300 shown in FIG. 13A taken along line Y according to embodiments of the invention. FIG. 19C depicts a cross-sectional view of the semiconductor device 1300 shown in FIG. 13A taken along line Z according to embodiments of the invention. FIG. 19D depicts a cross-sectional view of the semiconductor device 1300 shown in FIG. 13A taken along line Z according to embodiments of the invention. Anisotropic spacer recess is performed using, for example, a directional RIE. This recesses the low-k spacer material 1802 on the edges of the dummy gates 1504 as shown in FIG. 19A and on the edges of the channel layer 1308 as shown in FIG. 19D. Also, a portion of the low-k spacer material 1802 is removed from some of the STI material regions 1402.

FIG. 20A depicts a cross-sectional view of the semiconductor device 1300 shown in FIG. 13A taken along line X according to embodiments of the invention. FIG. 20B depicts a cross-sectional view of the semiconductor device 1300 shown in FIG. 13A taken along line Y according to embodiments of the invention. FIG. 20C depicts a cross-sectional view of the semiconductor device 1300 shown in FIG. 13A taken along line Z according to embodiments of the invention. FIG. 20D depicts a cross-sectional view of the semiconductor device 1300 shown in FIG. 13A taken along line Z according to embodiments of the invention. An anisotropic fin recess is performed using, for example, a directional RIE. Using the gate hard mask 1508 and the low-k spacer material 1802, the anisotropic fin recesses/trims portions of the channel layer 1308 which are not protected as shown in FIGS. 20A, 20B, and 20C. The low-k spacer material 1802 provides an etch stop for the fin recess, such that there is no substrate 202 over etch. In other words, the low-k spacer material 1802 protects the substrate 202 during the fin etch.

FIGS. 20A and 20D further show that the unprotected channel layer 1308 (fins) have been removed. Accordingly, formation of source or drain epitaxy 2002 is performed. The source or drain epitaxy 2002 can be NFET source/drain epitaxial regions or PFET source/drain epitaxial regions according to formation of the NFET or PFET devices. As such, the source or drain epitaxial regions 2002 can be doped with N-type dopants or P-type dopants as desired. The source or drain epitaxy 2002 can be epitaxially grown from the edges of the fin channel 1308.

Figure 21D:
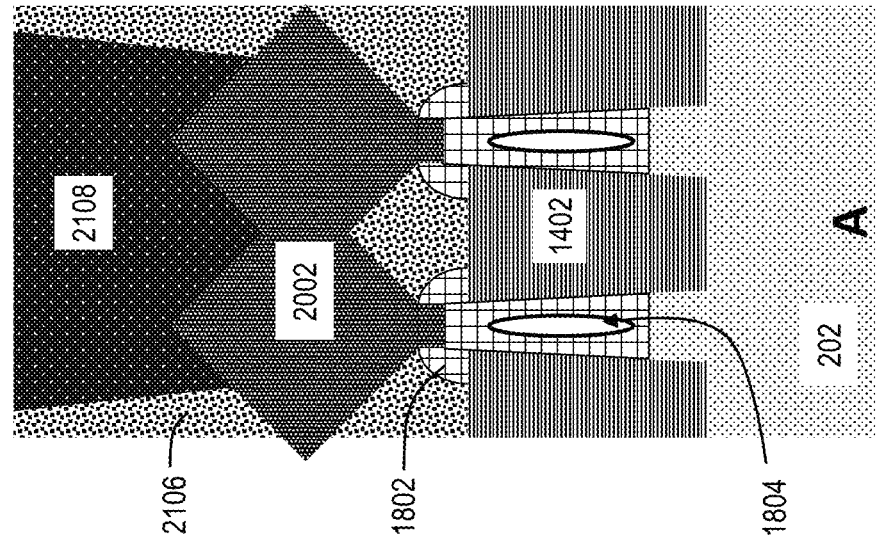
FIG. 21D depicts a cross-sectional view of the semiconductor device taken along line A (shown in FIG. 13A) after fabrication operations according to embodiments of the invention.
Figure 21C:
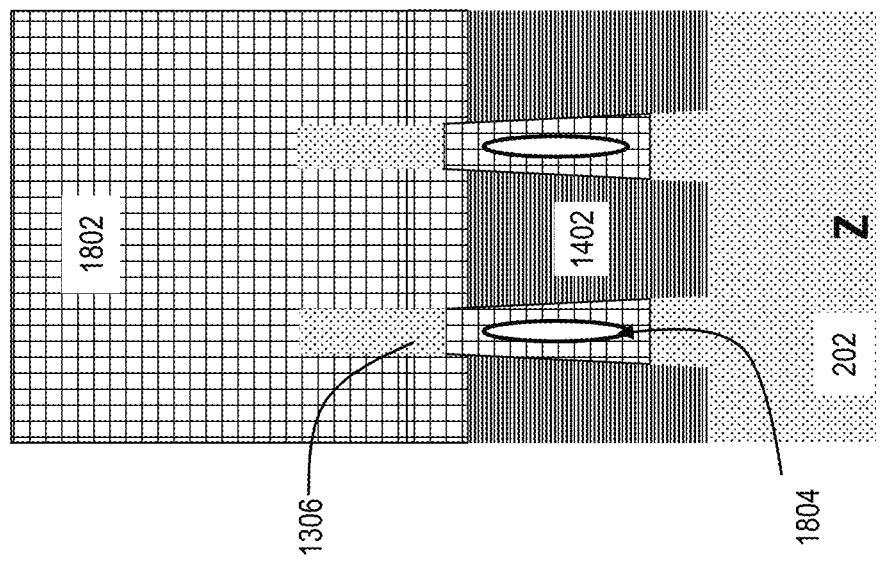
FIG. 21C depicts a cross-sectional view of the semiconductor device taken along line Z (shown in FIG. 13A) after fabrication operations according to embodiments of the invention.

FIG. 21A depicts a cross-sectional view of the semiconductor device 1300 shown in FIG. 13A taken along line X according to embodiments of the invention. FIG. 21B depicts a cross-sectional view of the semiconductor device 1300 shown in FIG. 13A taken along line Y according to embodiments of the invention. FIG. 21C depicts a cross-sectional view of the semiconductor device 1300 shown in FIG. 13A taken along line Z according to embodiments of the invention. FIG. 21D depicts a cross-sectional view of the semiconductor device 1300 shown in FIG. 13A taken along line Z according to embodiments of the invention.

An inter-level dielectric (ILD) material 2106 is then deposited to cap the Source-Drain epitaxy. The ILD material 2106 is a low-k dielectric material such as, for example, an oxide material like silicon dioxide. The ILD material 2106 is then recessed by chemical mechanical polishing (CMP) until the gate hardmask layer 1508 is reached.

Further, a replacement metal gate (RMG) process is performed. First, the gate hard mask 1508 is removed. An etch is then performed to selectively remove the dummy gate 1504, and the dummy dielectric layer 702 is etched. High-k metal gate (HKMG) formation is then performed to deposit HKMG layers 2102 which fill the previous locations of the dummy gate 1504, so as to cover the channel layer 1308 (i.e. fins) as seen in FIGS. 21A and 21B. A self-aligned contact (SAC) cap 2104 is formed on top of the HKMG layers 2102. The SAC cap 2104 is an insulating material, such as, a nitride (e.g., SiN), an oxide (e.g., SiO$_2$), etc.

Trench contact formation is performed in the ILD material 2106 over the source and drain epitaxy 2002, and the source and drain contacts 2108 are formed. The source and drain contacts 2108 can be referred to as trench silicide (TS) contacts. The material of the source and drain contacts 2108 can include one or more layers. The source and drain contacts 2108 can be a Ti/TiN stack in which the titanium (Ti) is deposited first and titanium nitride (TiN) second. Other materials of the source and drain contacts 2108 can be tungsten (W) for instance.

The HKMG 2102 includes one or more high-k dielectric materials (not shown) and one or more work function metals. The one or more work function metals can be NFET work function metals and/or one or more PFET work function metals. As discussed above, material of the HKMG 2102 can analogously include material of the HKMG 1204.

According to embodiments of the invention, a method of forming a semiconductor device 100 (e.g., nanosheet FET) is provided. The method includes forming a stack 250 over a bottom sacrificial layer 204, the bottom sacrificial layer 204 being on a substrate 202, removing at least a portion of the bottom sacrificial layer 204 so as to create indentions/openings 302, and forming inner spacers 650 in the openings 302 adjacent to the bottom sacrificial layer 204. The method includes removing the bottom sacrificial layer 204 so as to create a void 902 and forming an isolation layer 1002 (e.g., bottom dielectric isolation layer 1004) on the inner spacers 650 so as to form air gap 1050, the isolation layer 1002 (e.g., bottom dielectric isolation layer 1004) and the air gap 1050 being positioned between the stack 250 and the substrate 202.

Removing the portion of the bottom sacrificial layer 204 so as to create the openings 302 includes recessing sides of the bottom sacrificial layer 204. Recessing the sides of the bottom sacrificial layer 204 causes a width of the bottom sacrificial layer to be less than a width of the stack 250. The void 902 is between the stack 250 and the substrate 202. The void 902 is between the inner spacers 650. Source and drain regions 1202 are formed over the isolation layer 1002 (e.g., bottom dielectric isolation layer 1004) and the air gap 1050. The isolation layer 1002 and the air gap 1050 physically and electrically separate the source and drain regions 1202 from the substrate 202. The stack 250 includes channel layers 208 and a conductive gate structure 1204 is formed on the channel layers 208, and the isolation layer 1002 (e.g., bottom dielectric isolation layer 1004) separates a bottom portion of the conductive gate structure 1204 from the substrate 202.

The isolation layer 1002 includes a nitride. The isolation layer 1002 includes silicon boron carbide nitride. The source and drain regions 1202 are formed on the isolation layer 1002 and are operable to permit current flow via channel layers 208 in the stack 250, and the isolation layer 1002 is positioned to prevent current leakage from one of the source and drain regions 1202 to another one of the source and drain regions 1202 via the substrate 202.

According to embodiments of the invention, a method of forming a semiconductor device 1300 (e.g., FinFET) is provided. The method includes forming at least one fin (e.g., patterned channel layer 1308) over a bottom sacrificial layer 1306, the bottom sacrificial layer 1306 being on a substrate 202, removing the bottom sacrificial layer 1306 so as to create an opening 1702, and forming an isolation layer 1802 on the at least one fin (the patterned channel layers 1308) and the substrate 202 so as to form the opening into an air gap 1804, the isolation layer 1802 and the air gap 1804 being positioned between the at least one fin 1308 and the substrate 202.

The isolation layer 1802 encapsulates the opening 1702 to thereby form the air gap 1804. The air gap 1804 is between the at least one fin 1308 and the substrate 202. Source and drain regions 2002 are formed over the isolation layer 1802 and the air gap 1804. The isolation layer 1802 and the air gap 1804 physically and electrically separate the source and drain regions 2002 from the substrate 202. The isolation layer 1802 includes a nitride. The isolation layer 1802 includes silicon boron carbide nitride. Source and drain regions 2002 are formed on the isolation layer 1802 and are operable to permit current flow via the at least one fin 1308, and the isolation layer 1802 is positioned to prevent current leakage from one of the source and drain regions 2002 to another one of the source and drain regions 2002 via the substrate 202.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings.

Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:

forming a stack over a bottom sacrificial layer, the bottom sacrificial layer being on a substrate;

removing at least a portion of the bottom sacrificial layer so as to create openings;

forming inner spacers in the openings adjacent to the bottom sacrificial layer;

removing the bottom sacrificial layer so as to create a void;

forming an isolation layer on the inner spacers so as to form an air gap, the isolation layer and the air gap being positioned between the stack and the substrate; and forming source and drain regions overlying both the isolation layer and the air gap having been formed by the isolation layer.

2. The method of claim 1, wherein removing the portion of the bottom sacrificial layer so as to create the openings comprises recessing sides of the bottom sacrificial layer.

3. The method of claim 2, wherein recessing the sides of the bottom sacrificial layer causes a width of the bottom sacrificial layer to be less than a width of the stack.

4. The method of claim 1, wherein the void is between the stack and the substrate.

5. The method of claim 1, wherein the void is between the inner spacers.

6. The method of claim 1, wherein the isolation layer and the air gap physically and electrically separate the source and drain regions from the substrate.

7. The method of claim 1, wherein:

the stack comprises a plurality of channel layers, each of the plurality of channels layers being separate from one another;

a conductive gate structure is formed on the plurality of channel layers; and the isolation layer separates a bottom portion of the conductive gate structure from the substrate.

8. The method of claim 1, wherein the isolation layer comprises a nitride.

9. The method of claim 1, wherein the isolation layer comprises silicon boron carbide nitride.

10. The method of claim 1, wherein:

source and drain regions are formed on the isolation layer and are operable to permit current flow via channel layers in the stack; and the isolation layer is positioned to prevent current leakage from one of the source and drain regions to another one of the source and drain regions via the substrate.

* * * * *